United States Patent
Yoshida et al.

(10) Patent No.: US 11,069,754 B2
(45) Date of Patent: Jul. 20, 2021

(54) DISPLAY DEVICE

(71) Applicant: Tianma Japan, Ltd., Kanagawa (JP)

(72) Inventors: Hitoshi Yoshida, Kawasaki (JP); Akira Fujita, Kawasaki (JP)

(73) Assignee: TIANMA MICROELECTRONICS CO., LTD., Shenzhen (CN)

(*) Notice: Subject to any disclaimer, the term of this patent is extended or adjusted under 35 U.S.C. 154(b) by 68 days.

(21) Appl. No.: 16/004,605

(22) Filed: Jun. 11, 2018

(65) Prior Publication Data
US 2018/0366523 A1    Dec. 20, 2018

(30) Foreign Application Priority Data

Jun. 20, 2017 (JP) .............................. JP2017-120313
Feb. 8, 2018 (JP) .............................. JP2018-021034

(51) Int. Cl.
*H01L 27/32* (2006.01)
*H01L 51/52* (2006.01)
(Continued)

(52) U.S. Cl.
CPC ........ *H01L 27/3227* (2013.01); *G01J 1/0204* (2013.01); *G01J 1/0214* (2013.01);
(Continued)

(58) Field of Classification Search
CPC .............. H01L 27/3227; H01L 27/3272; H01L 51/524; H01L 51/5281; H05K 1/189;
(Continued)

(56) References Cited

U.S. PATENT DOCUMENTS

2009/0066862 A1* 3/2009 Ishii .................. G02F 1/133308
349/12
2009/0183819 A1 7/2009 Matsuhira
(Continued)

FOREIGN PATENT DOCUMENTS

CN        101387769 A    3/2009
CN        101443839 A    5/2009
(Continued)

OTHER PUBLICATIONS

Office Action dated Jan. 28, 2021 in Chinese Application No. 201810474542.0.

*Primary Examiner* — Que Tan Le
*Assistant Examiner* — Don J Williams
(74) *Attorney, Agent, or Firm* — Sughrue Mion, PLLC

(57) ABSTRACT

A display device includes: a display panel including a display region where a user image is displayed and a measurement region; a transparent front panel disposed on a front side of the display panel; a bonding layer provided between the display panel and the front panel to avoid a first space and cover the display region, and bonding the display panel and the front panel together; and a component placed in the first space, the component including a detector configured to detect a physical property of the measurement region in the first space and flexible print circuits with the detector mounted thereon, and the flexible print circuits extending from the first space to an outside of an interspace between the display panel and the front panel.

15 Claims, 25 Drawing Sheets

(51) Int. Cl.
*G06K 9/00* (2006.01)
*G01J 1/42* (2006.01)
*G01J 1/02* (2006.01)
*G01J 1/32* (2006.01)
*G02F 1/1333* (2006.01)
*G01J 1/04* (2006.01)
*G02F 1/133* (2006.01)
*G09G 3/3208* (2016.01)
*G09G 3/36* (2006.01)
*H05K 1/18* (2006.01)
*H05K 3/40* (2006.01)

(52) U.S. Cl.
CPC ............... *G01J 1/0403* (2013.01); *G01J 1/32* (2013.01); *G01J 1/4204* (2013.01); *G02F 1/133308* (2013.01); *G06K 9/0004* (2013.01); *H01L 51/524* (2013.01); *H01L 51/5281* (2013.01); *G01J 2001/4247* (2013.01); *G02F 1/13318* (2013.01); *G02F 1/133331* (2021.01); *G02F 2202/28* (2013.01); *G09G 3/3208* (2013.01); *G09G 3/36* (2013.01); *G09G 2320/0626* (2013.01); *G09G 2360/144* (2013.01); *G09G 2360/145* (2013.01); *H01L 27/3272* (2013.01); *H05K 1/189* (2013.01); *H05K 3/403* (2013.01); *H05K 2201/10121* (2013.01); *H05K 2201/10136* (2013.01); *H05K 2201/10151* (2013.01)

(58) Field of Classification Search
CPC ........... H05K 3/403; H05K 2201/0121; H05K 2201/10136; H05K 2201/10151; G01J 1/0204; G01J 1/0214; G01J 1/0403; G01J 1/32; G01J 1/4204; G01J 2001/4247; G02F 1/133308; G02F 1/13318; G02F 2001/133331; G02F 2202/28; G06K 9/0004; G09G 2320/0626; G09G 2360/144; G09G 2360/145
See application file for complete search history.

(56) References Cited

U.S. PATENT DOCUMENTS

| | | |
|---|---|---|
| 2009/0231313 A1 | 9/2009 | Teranishi et al. |
| 2011/0069051 A1* | 3/2011 | Nakamura ........... G09G 3/3233 345/207 |
| 2015/0206482 A1 | 7/2015 | Ito et al. |
| 2015/0371579 A1* | 12/2015 | Yu ........................ G09G 3/2003 345/690 |

FOREIGN PATENT DOCUMENTS

| | | |
|---|---|---|
| JP | 2009-175701 A | 8/2009 |
| WO | 2013/102997 A1 | 7/2013 |

* cited by examiner

DISPLAY DEVICE

CROSS-REFERENCE TO RELATED APPLICATIONS

This Non-provisional application claims priority under 35 U.S.C. § 119(a) on Patent Application No. 2017-120313 filed in Japan on Jun. 20, 2017, and Patent Application No. 2018-021034 filed in Japan on Feb. 8, 2018 the entire contents of which are hereby incorporated by reference.

BACKGROUND

This disclosure relates to a display device. In recent years, the required display quality for display devices has been elevated. For example, in the field of medical monitors, the significance of diagnostic imaging has produced a demand for a function (calibration) that constantly monitors the monitor luminance with an optical sensor and performs feedback control based thereon because variation in monitor luminance causes variation in gradation display characteristics (refer to WO 2013/102997 A, for example).

Meanwhile, display devices having a transparent front panel on the front side of the display module are increasing; the transparent front panel can be an input interface component like a touch panel or can be provided for the purpose of design or protection of the surface of the display panel. If an air layer exists between the surface of the display panel of the display module and the front panel, reflection of light occurs at the interface between the front panel (a glass plate, for example) and the air layer having different refractive indices, as an optical characteristic.

The interfacial reflection seriously impairs the visibility of the displayed image. To soften the impairment in visibility, a technique has been proposed. The technique interposes a transparent optically elastic resin layer having a refractive index close to those of the panels to reduce the interfacial reflection and improve the visibility of the displayed image (refer to JP 2009-175701 A, for example).

This bonding technique is called optical bonding (OB); it has not only the optical effects but also mechanical effects such as providing shatter protection in case of breakage of the front panel and increasing the impact resistance. To form an optically elastic resin layer, optically clear resin (OCR) or optically clear adhesive (OCA) can be used. The OCR is a liquid resin that cures with UV light or heat and the OCA is a sheet-type baseless adhesive tape.

SUMMARY

Like a medical monitor with an optical sensor embedded and a display device with a touch panel and a fingerprint authentication device incorporated, some types of display devices are required to have a component such as an optical sensor or a fingerprint sensor between a front panel and a display panel bonded by OB.

However, to achieve such a structure where a component is disposed on the optically elastic resin layer, the component needs to be safe from breakage because of pressure to the component in bonding the front panel and the display panel with an optically elastic resin. The pressure to the component can be avoided by putting the component in a hole formed on the back face of the front panel, for example. In this structure, however, the bonding could be insufficient in the area under the component; bubbles may be generated in the optically elastic resin layer.

If a bubble exists between a detector (sensor) of a component and the display panel, the bubble diffuses the light and disturbs correct measurement of a physical property such as luminance. Furthermore, when an optically elastic resin is provided between the detector and the display panel, more external light other than the light from the display panel enters the detector, which makes correct measurement difficult.

The component can be embedded in the optically elastic resin layer in the case of using OCR. However, the component may disturb smooth filling with liquid optically elastic resin to cause bubbles in the cured optically elastic resin. The bubbles in the optically elastic resin layer impair the display quality of the display device. The optically elastic resin may get into the component to impair the performance of the component.

An aspect of this disclosure is a display device including: a display panel including a display region where a user image is displayed and a measurement region; a transparent front panel disposed on a front side of the display panel; a bonding layer provided between the display panel and the front panel to avoid a first space and cover the display region, and bonding the display panel and the front panel together; and a component placed in the first space, the component including a detector configured to detect a physical property of the measurement region in the first space and flexible print circuits with the detector mounted thereon, and the flexible print circuits extending from the first space to an outside of an interspace between the display panel and the front panel.

It is to be understood that both the foregoing general description and the following detailed description are exemplary and explanatory and are not restrictive of this disclosure.

EMBODIMENTS

Hereinafter, embodiments of this disclosure will be described with reference to the accompanying drawings. It should be noted that the embodiments are merely examples to implement this disclosure and are not to limit the technical scope of this disclosure. Elements common to the drawings are denoted by the same reference signs.

Figure 1A:
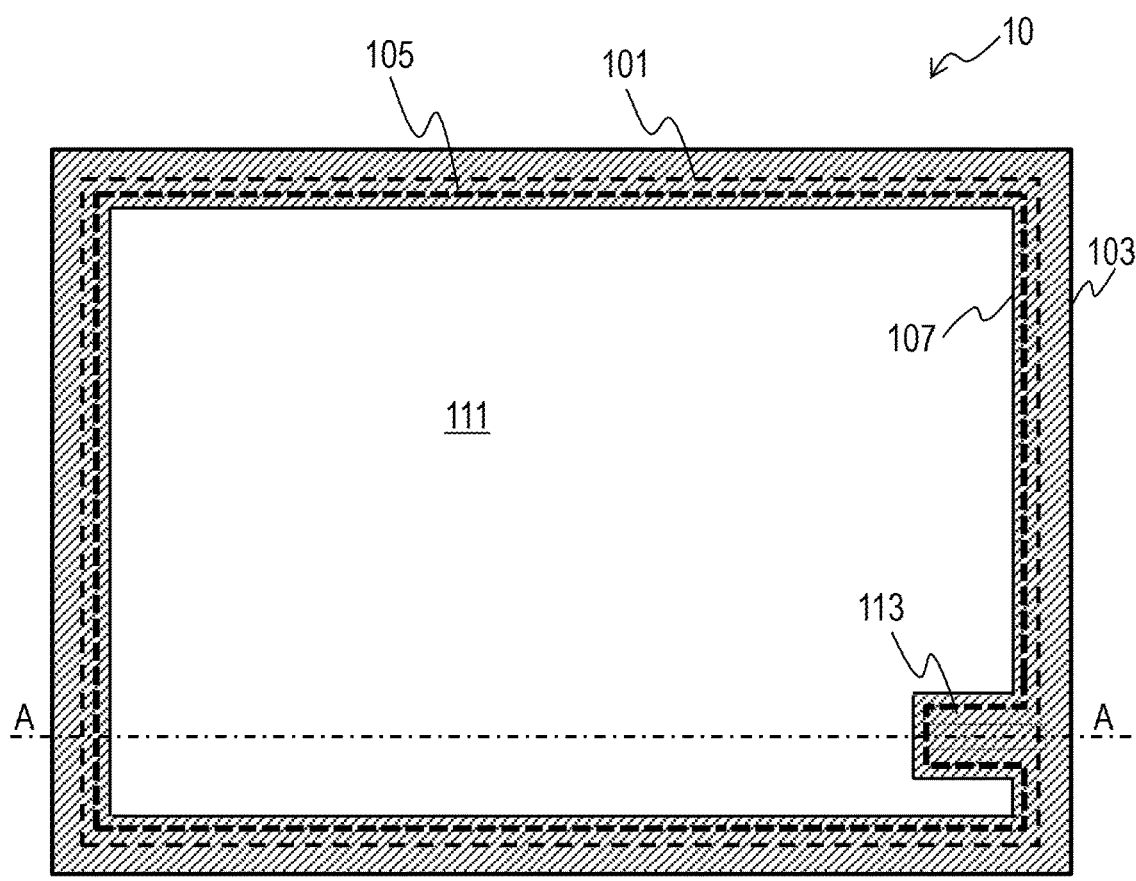
FIG. 1A schematically illustrates a configuration example of a display device.
Figure 1B:
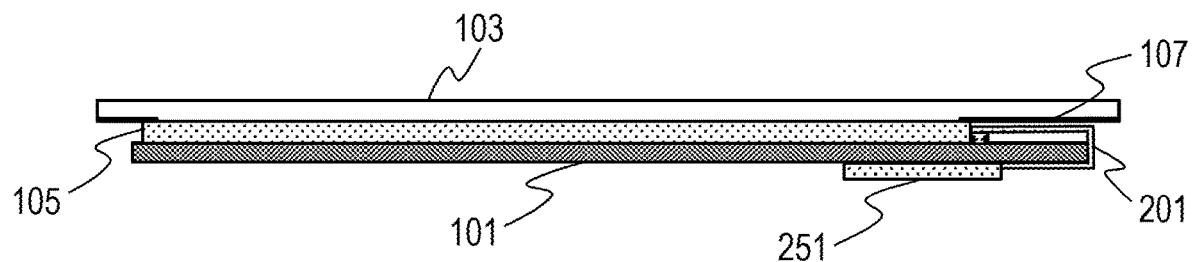
FIG. 1B is a cross-sectional diagram cut along the line A-A in FIG. 1A.

FIGS. 1A and 1B schematically illustrate a configuration example of a display device. FIG. 1A is a plan diagram of a display device 10 and FIG. 1B is a cross-sectional diagram cut along the line A-A in FIG. 1A. As illustrated in FIG. 1B, the display device 10 includes a display panel 101 and a front panel 103 superimposed on the display panel 101. In the example of FIGS. 1A and 1B, the display panel 101 and the front panel 103 have rectangular shapes. These panels can have different shapes. The display panel 101 can be of any type; for example, the display panel 101 can be a liquid crystal display panel or an organic light emitting diode (OLED) display panel.

An optically elastic resin layer 105 is provided between the front panel 103 and the display panel 101 to bond them together. The optically elastic resin layer 105 is a bonding layer. The front panel 103 and the display panel 101 are bonded objects. The user sees the image displayed on the display panel 101 through the optically elastic resin layer 105 and the front panel 103.

In the following description, the side (face) seen by the user is also called a front side (front face) and the opposite side (the other face) is also called a back side (back face). A direction along the front faces of the display panel 101 and the front panel 103 is also referred to as in-plane direction and a direction in which the display panel 101 and the front panel 103 are stacked is also referred to as stacking direction.

As illustrated in FIG. 1A, the front face (the side to be seen by the user) of the display panel 101 includes a display region 111 and a measurement region 113. The display region 111 and the measurement region 113 are areas including arrayed pixels. The display region 111 displays a user image to be seen by the user. The measurement region 113 displays an image to measure a property of the display panel. The image for the measurement can be in a single color or multiple colors.

In the example of FIGS. 1A and 1B, the display region 111 is substantially rectangular and has an indent (or a notch) in the peripheral end. The measurement region 113 is rectangular and corresponds to the indent of the display region 111. The display region 111 and the measurement region 113 can have any shape.

Between the measurement region 113 and the front panel 103, an optical sensor 201 is provided. The optical sensor 201 is a component to measure a physical property in the measurement region 113; specifically, it measures the luminance of the direct light in the single color or each of the multiple colors emitted from the measurement region 113. The direct light is the light emitted from the measurement region 113 and directly and perpendicularly incident on the optical sensor 201 at the highest luminance. The optical sensor 201 is connected with a controller 251 fixed on the back face of the display panel 101.

The controller 251 controls the image displayed in the display region 111 based on the value measured by the optical sensor 201. The measurement region 113 having the same pixels as the display region 111 enables accurate estimation of the display condition in the display region 111 for appropriate feedback of changes in the display region 111.

The optically elastic resin layer 105 is made of optically clear adhesive (OCA), for example. OCA is capable of bonding with adhesive force of 1 to 50 N/mm$^2$. The optically elastic resin layer 105 is transparent and has a refractive index proximate to those of the transparent front panel 103 and the transparent substrate of the display panel 101. The front panel 103 and the transparent substrate of the display panel 101 are made of glass or resin. The optically elastic resin layer 105 can be made of acrylic resin, urethane resin, or silicone resin, for example.

The display panel 101 and the front panel 103 can be bonded together by pressing the front panel 103 onto the display panel 101 with OCA pasted in a specified shape.

As illustrated in FIG. 1A, the optically elastic resin layer 105 is provided to cover the entire display region 111 of the display panel 101. However, the optically elastic resin layer 105 is provided to avoid the space between the measurement region 113 of the display panel 101 and the front panel 103. This space is a space to place (insert) the optical sensor 201.

As illustrated in FIG. 1B, a light-blocking layer 107 is provided on the back face of the front panel 103. The light-blocking layer 107 is formed by printing or providing a sheet. The light-blocking layer 107 can be provided on the front face of the front panel 103. The same applies to the light-blocking layers in the other configuration examples to be described later.

As illustrated in FIG. 1A, the light-blocking layer 107 is provided in the area opposite to the area excluding and surrounding the display region 111 of the display panel 101. The light-blocking layer 107 may overlap with the rim of the display region 111. The light-blocking layer 107 covers the entire peripheral end of the display panel 101 and the entire peripheral end of the optically elastic resin layer 105 (denoted by dashed lines in FIG. 1A). The light-blocking layer 107 covers the entire area of the measurement region 113.

Figure 2A:
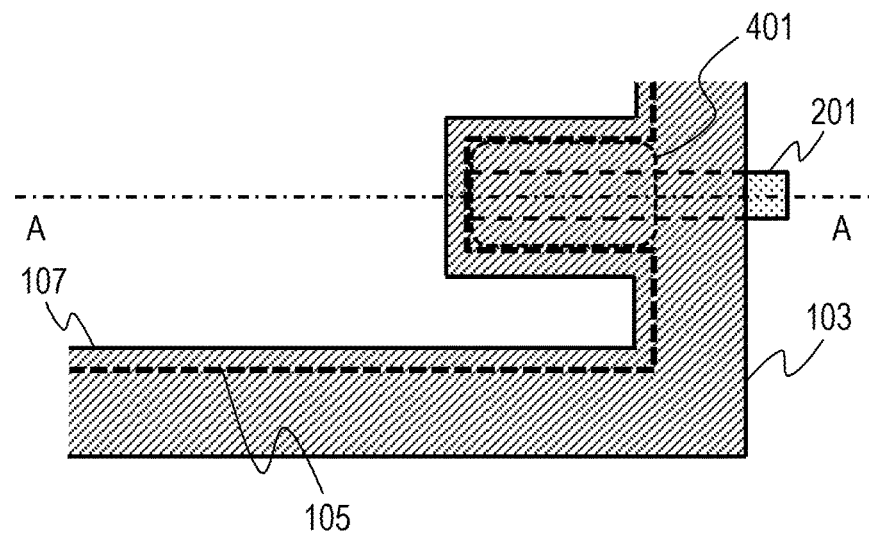
FIG. 2A illustrates an example of the shape of an optically elastic resin layer.
Figure 2B:
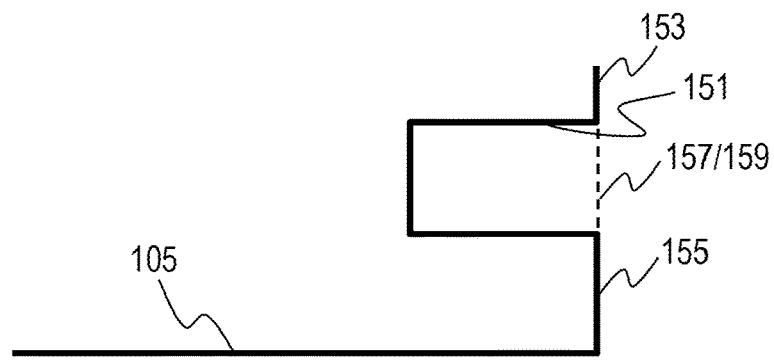
FIG. 2B schematically illustrates a configuration of a measurement region of the display device and the proximity thereof.
Figure 2C:
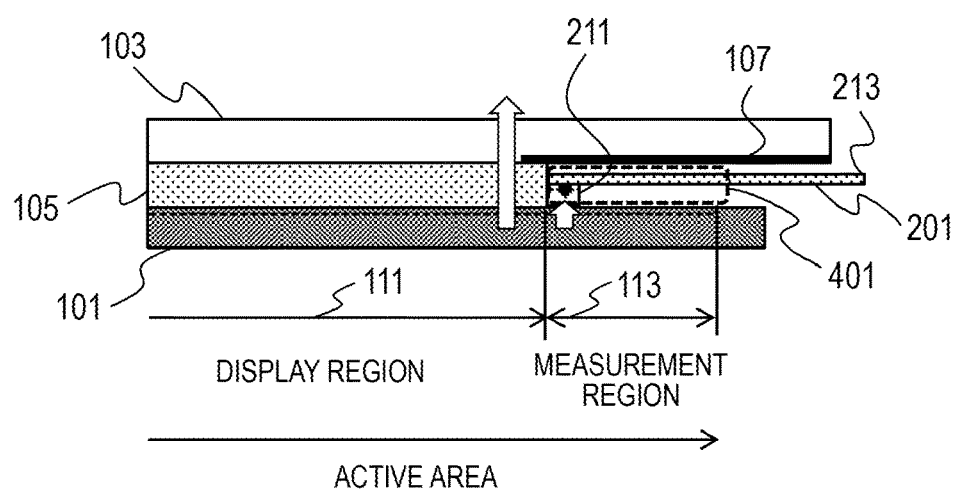
FIG. 2C is a cross-sectional diagram cut along the line A-A in FIG. 2A.

FIGS. 2A, 2B, and 2C schematically illustrate a configuration of the measurement region 113 of the display device 10 and the proximity thereof. FIG. 2A is a plan diagram for illustrating the relation of the front panel 103, the light-blocking layer 107, the optically elastic resin layer 105, and the optical sensor 201. FIG. 2B is a plan diagram for illustrating the shape of the optically elastic resin layer 105. FIG. 2C is a cross-sectional diagram cut along the line A-A in FIG. 2A. The components are partially omitted in these drawings, if not necessary. The same applies to the other drawings to be described later.

As illustrated in FIG. 2A, the light-blocking layer 107 is provided in the rim region of the front panel 103 and completely covers the peripheral end of the optically elastic resin layer 105 (denoted by a dashed line) and the space 401 to place the optical sensor 201. The space 401 is a space produced by not providing the optically elastic resin layer 105 between the display panel 101 and the front panel 103 to contain the optical sensor 201 (at least a part thereof).

As illustrated in FIG. 2B, the optically elastic resin layer 105 has an indent (hole) in its peripheral end. As illustrated in FIGS. 2A and 2C, the space 401 is defined by the indent (hole) 151 between the front panel 103 and the display panel 101. The three inner faces (walls) of the indent 151 are exposed to the space 401 and accordingly, each inner face (wall) partially defines the space 401.

The space 401 is provided inside of a virtual face 157 extending in parallel to the outer end face 153 of the optically elastic resin layer 105 from the edge of the outer end face 153 and a virtual face 159 extending in parallel to the outer end face 155 from the edge of the outer end face 155. In this example, these two virtual faces 157 and 159 are the same face. The space 401 is a space open (not closed) at the virtual face 157/159 and this virtual face partially defines the space 401. The space 401 is held light-tight with a non-illustrated case or chassis so that external light coming from the virtual face 157/159 will not affect detection with the optical sensor 201.

As illustrated in FIG. 2C, the light-blocking layer 107 (a part thereof) is exposed to the space 401. The optical sensor 201 includes a photodetector 211 of an element and flexible printed circuits (FPC) 213 with the photodetector 211 mounted thereon. The FPC 213 connects the photodetector 211 to the controller 251. The photodetector 211 and a part of the FPC 213 are contained in the space 401.

The photodetector 211 is provided on the face of the FPC 213 opposite to the measurement region 113 and measures the luminance of the measurement region 113. The light-blocking layer 107 completely covers the measurement region 113 to reduce the external light that could be detected by the photodetector 211. As indicated in FIG. 2C, the area including the display region 111 and the measurement region 113 is referred to as active area. The active area is an area including pixels arrayed on the display panel 101. The measurement region 113 may be partially covered with the optically elastic resin layer 105. The photodetector 211 measures the luminance of the area exposed to the space 401.

The photodetector 211 may be in contact with or distant from the display panel 101. The photodetector 211 may be fixed to the display panel 101. The FPC 213 may be in contact with or distant from the front panel 103. The FPC 213 may be fixed to the front panel 103. It is more preferable that the photodetector 211 be in contact with the display panel 101. Such a configuration prevents the external light from coming through the interspace between the display panel 101 and the photodetector 211 and therefore, the reliability of the detection increases.

The optical sensor 201 may be fixed to the display panel 101 or the front panel 103 before the display panel 101 and the front panel 103 are bonded together. However, it is preferable that the optical sensor 201 be in contact with the display panel 101 because the optical sensor 201 is more affected by the external light if an interspace exists between the sensor component 201 and the display panel 101. The optical sensor 201 may be inserted in the space 401 after the display panel 101 and the front panel 103 are bonded together.

Figure 3A:
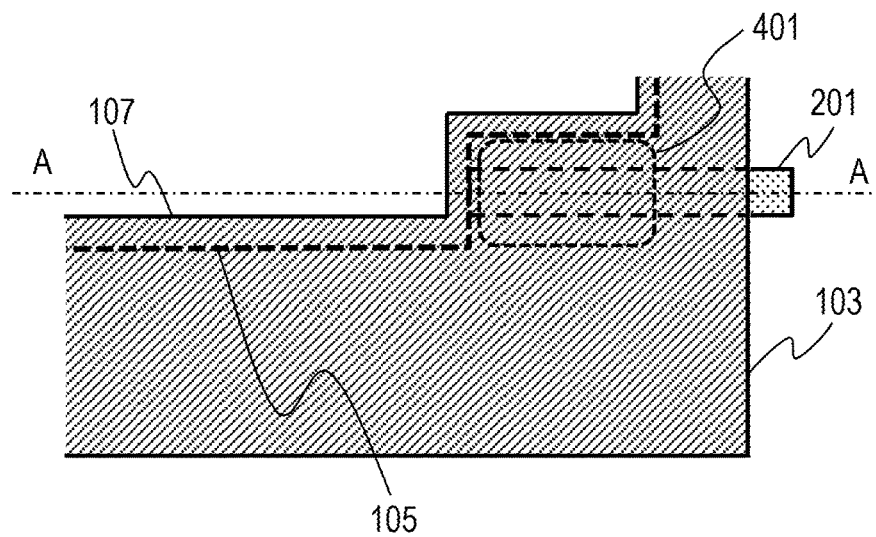
FIG. 3A schematically illustrates another example of a space.
Figure 3B:
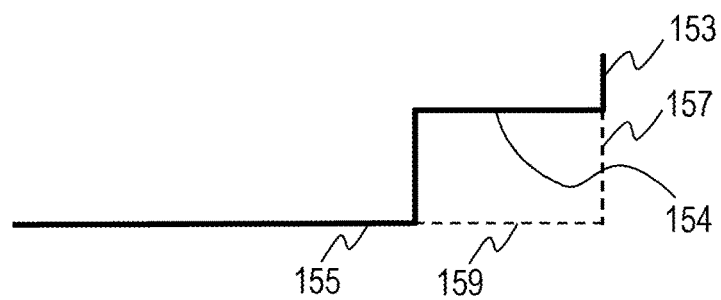
FIG. 3B illustrates an example of the shape of the optically elastic resin layer.
Figure 3C:
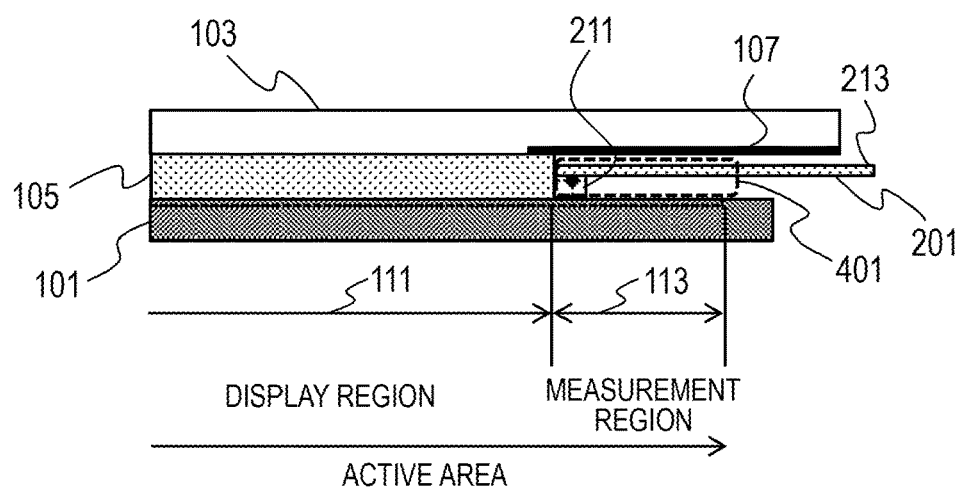
FIG. 3C is a cross-sectional diagram cut along the line A-A in FIG. 3A.

FIGS. 3A, 3B and 3C schematically illustrate another example of the space 401. FIG. 3A is a plan diagram for illustrating the relation of the front panel 103, the light-blocking layer 107, the optically elastic resin layer 105, and the optical sensor 201. FIG. 3B is a plan diagram for illustrating the shape of the optically elastic resin layer 105. FIG. 3C is a cross-sectional diagram cut along the line A-A in FIG. 3A.

Differences from the configuration illustrated in FIGS. 2A, 2B, and 2C are mainly described. In this configuration example, the space 401 is provided on a corner of the optically elastic resin layer 105. The space 401 is formed in such a shape that a corner of the rectangular optically elastic resin layer 105 is cut off. This configuration prevents the space 401 from becoming an obstacle in seeing the display region 111.

As illustrated in FIG. 3B, the optically elastic resin layer 105 has an indent 154 provided on a corner. As illustrated in FIGS. 3A and 3C, the space 401 is defined by the indent 154 between the front panel 103 and the display panel 101. Two faces (walls) of the indent 154 is exposed to the space 401 and each of the two faces (walls) partially defines the space 401.

The space 401 is provided inside of a virtual face 157 extending in parallel to the outer end face 153 of the optically elastic resin layer 105 from the edge of the outer end face 153 and a virtual face 159 extending in parallel to the outer end face 155 from the edge of the outer end face 155. The space 401 is a space open (not closed) at the virtual faces 157 and 159 and each of the virtual faces 157 and 159 partially defines the space 401.

Figure 4A:
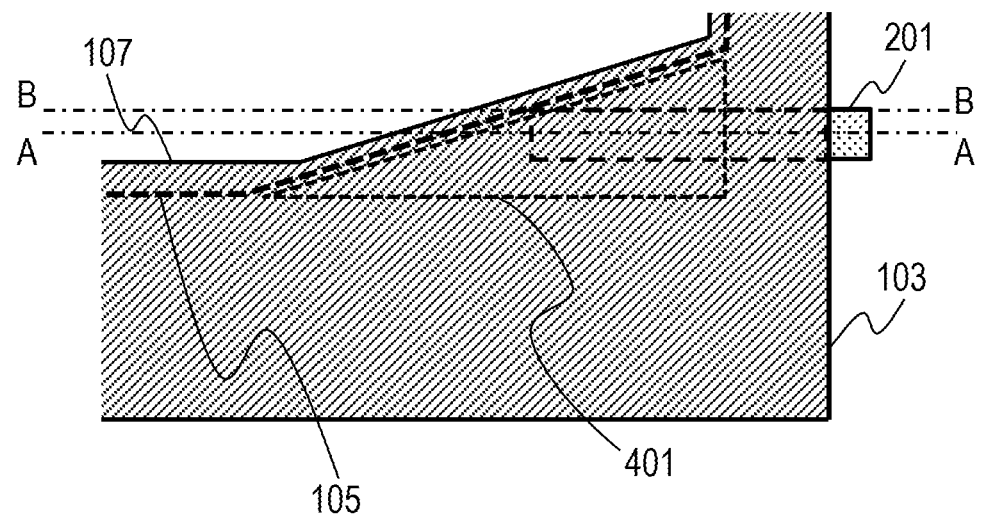
FIG. 4A schematically illustrates still another example of the space.
Figure 4B:
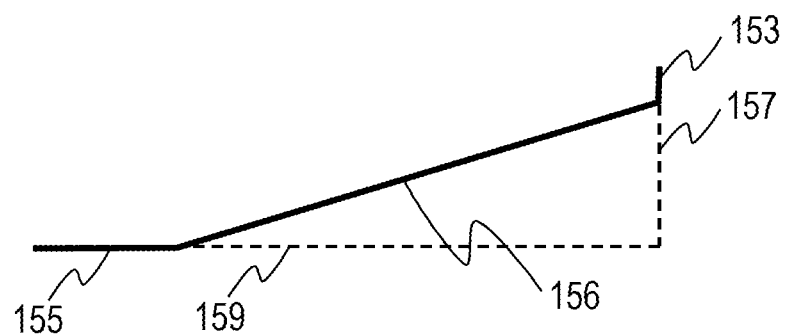
FIG. 4B illustrates an example of the shape of the optically elastic resin layer.
Figure 4C:
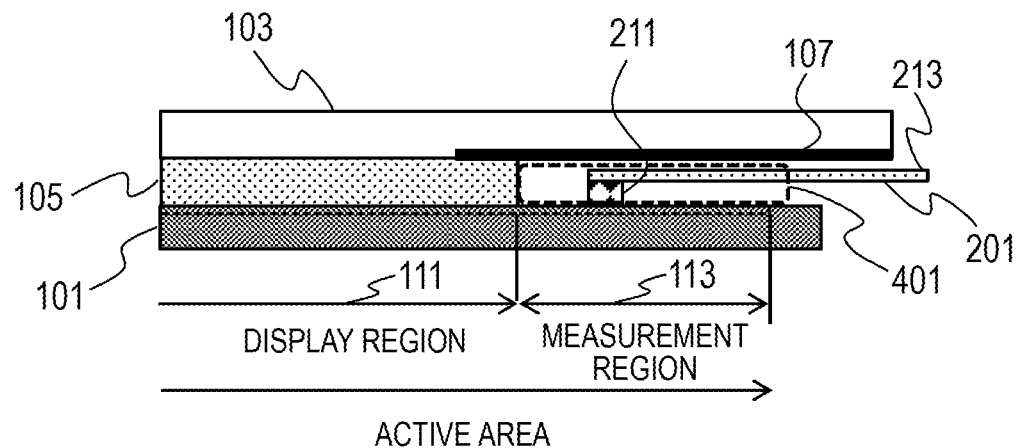
FIG. 4C is a cross-sectional diagram cut along the line A-A in FIG. 4A.
Figure 4D:
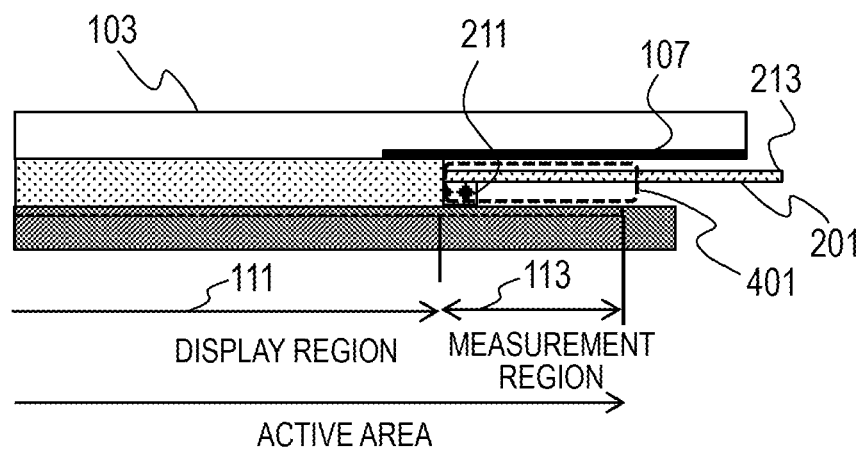
FIG. 4D is a cross-sectional diagram cut along the line B-B in FIG. 4A.

FIGS. 4A to 4D schematically illustrate still another example of the space 401. FIG. 4A is a plan diagram for illustrating the relation of the front panel 103, the light-blocking layer 107, the optically elastic resin layer 105, and the optical sensor 201. FIG. 4B is a plan diagram for illustrating the shape of the optically elastic resin layer 105. FIG. 4C is a cross-sectional diagram cut along the line A-A in FIG. 4A. FIG. 4D is a cross-sectional diagram cut along the line B-B in FIG. 4A.

Differences from the configuration illustrated in FIGS. 2A, 2B, and 2C are mainly described. In this configuration example, the space 401 is provided on a corner of the optically elastic resin layer 105. The space 401 is formed in such a shape that a corner of the rectangular optically elastic resin layer 105 is obliquely cut off. This configuration improves the design. In FIG. 4A, the rim of the optically elastic resin layer 105 defining the space 401 may be curved. That is to say, the end face of the optically elastic resin layer 105 exposed to the space 401 may be a curved face.

As illustrated in FIG. 4B, the optically elastic resin layer 105 has a cut-out 156 provided on a corner. As illustrated in FIGS. 4A, 4C and 4D, the space 401 is defined by the cut-out 156 between the front panel 103 and the display panel 101. One face (wall) of the cut-out 156 is exposed to the space 401 and the face (wall) partially defines the space 401.

The space 401 is provided inside of a virtual face 157 extending in parallel to the outer end face 153 of the optically elastic resin layer 105 from the edge of the outer end face 153 and a virtual face 159 extending in parallel to the outer end face 155 from the edge of the outer end face 155. The space 401 is a space open (not closed) at the virtual faces 157 and 159 and each of the virtual faces 157 and 159 partially defines the space 401.

Figure 5A:
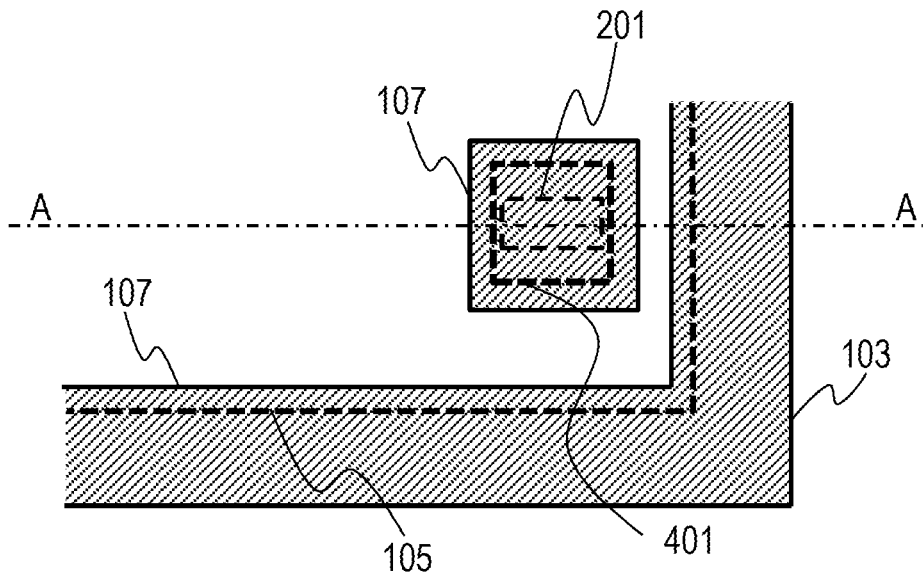
FIG. 5A schematically illustrates still another example of the space.
Figure 5B:
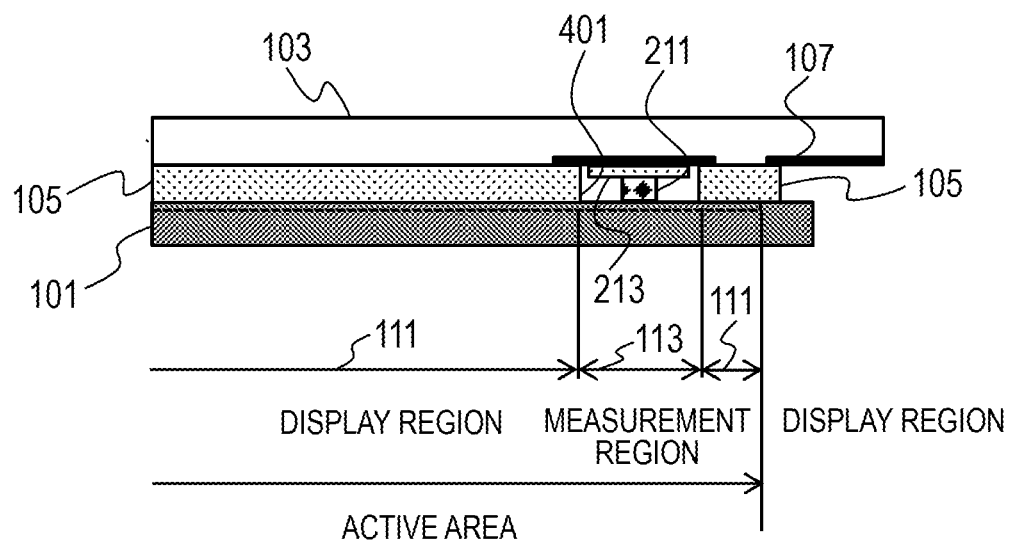
FIG. 5B is a cross-sectional diagram cut along the line A-A in FIG. 5A.

FIGS. 5A and 5B schematically illustrate still another example of the space 401. FIG. 5A is a plan diagram for illustrating the relation of the front panel 103, the light-blocking layer 107, the optically elastic resin layer 105, and the optical sensor 201. FIG. 5B is a cross-sectional diagram cut along the line A-A in FIG. 5A. In the following, differences from the configuration illustrated in FIGS. 2A, 2B, and 2C are mainly described.

As illustrated in FIGS. 5A and 5B, the space 401 in this configuration example is provided in the middle of the optically elastic resin layer 105 and is a closed hole. This configuration prevents a foreign object coming from the external from attaching to the optical sensor 201.

The space 401 is surrounded by the optically elastic resin layer 105. Specifically, the space 401 is surrounded by four end faces of the optically elastic resin layer 105 in the in-plane direction and sandwiched by the front panel 103 and the display panel 101 in the stacking direction. A part of the front panel 103, a part of the display panel 101, the four end faces of the optically elastic resin layer 105 are exposed to the space 401. The end faces of the optically elastic resin layer 105 defining the space 401 can have any shapes.

The entire component of the optical sensor 201 inclusive of the FPC 213 is contained in the space 401. The FPC 213 is not physically connected with the controller 251 and is distant from the controller 251. The optical sensor 201 communicates with the controller 251 by wireless.

The light-blocking layer 107 has a rim region covering the rim of the front panel 103 and an island region distant from the rim region to cover the space 401. A part of the light-blocking layer 107 is provided to cover the entirety of the space 401 provided in the middle of the optically elastic resin layer 105. The entire area of the front panel 103 exposed to the space 401 is covered with the light-blocking layer 107. The optical sensor 201 is fixed to the front panel 103 or the display panel 101 before the front panel 103 and the display panel 101 are bonded together.

Figure 6A:
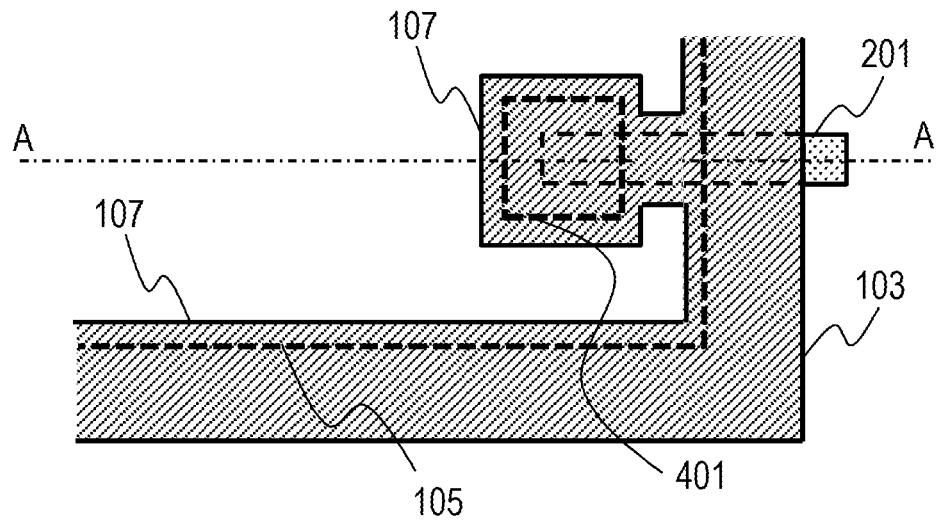
FIG. 6A schematically illustrates still another example of the space.
Figure 6B:
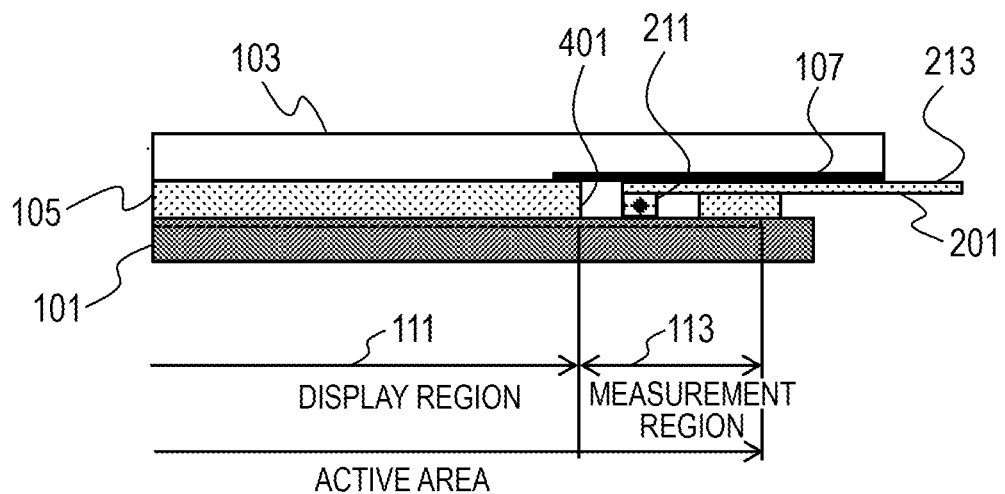
FIG. 6B is a cross-sectional diagram cut along the line A-A in FIG. 6A.

FIGS. 6A and 6B schematically illustrate still another example of the space 401. FIG. 6A is a plan diagram for illustrating the relation of the front panel 103, the light-blocking layer 107, the optically elastic resin layer 105, and the optical sensor 201. FIG. 6B is a cross-sectional diagram cut along the line A-A in FIG. 6A. In the following, differences from the configuration illustrated in FIGS. 5A and 5B are mainly described.

The FPC 213 extends from the space 401 to the external and is connected with the controller 251. The FPC 213 extends between the optically elastic resin layer 105 and the front panel 103. The light-blocking layer 107 is provided in one continuous area. The light-blocking layer 107 is provided to cover the FPC 213 extending from the space 401 to the external. This configuration prevents the FPC 213 from being seen by the user.

For example, the thickness of the optically elastic resin layer 105 in the area where the optically elastic resin layer 105 overlaps with the FPC 213 is thinner than the one in the area where the optically elastic resin layer 105 does not overlap with the FPC 213 by the thickness of the FPC 213. This configuration reduces the weight application to the display panel 101 because of the compression of the optically elastic resin layer 105, preventing display unevenness.

Figure 7A:
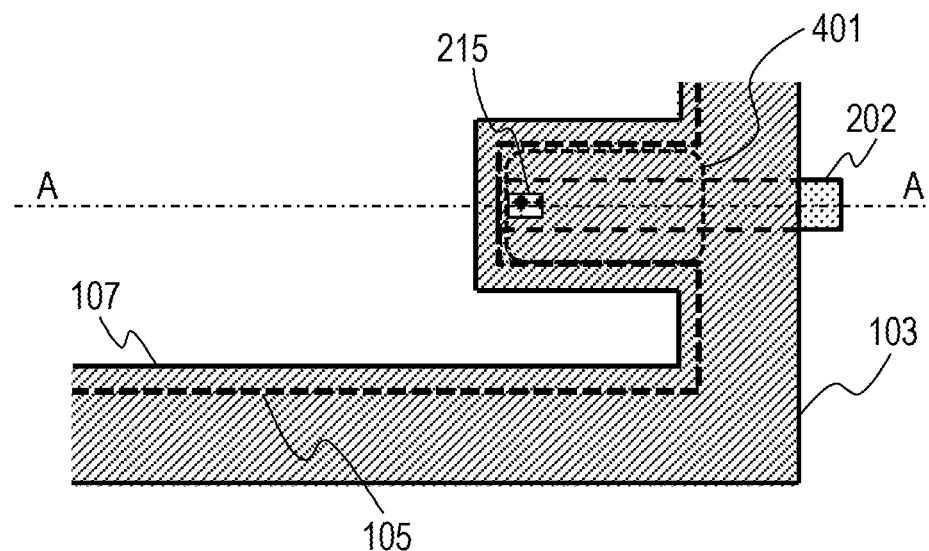
FIG. 7A illustrates another example of a functional component and disposition thereof.
Figure 7B:
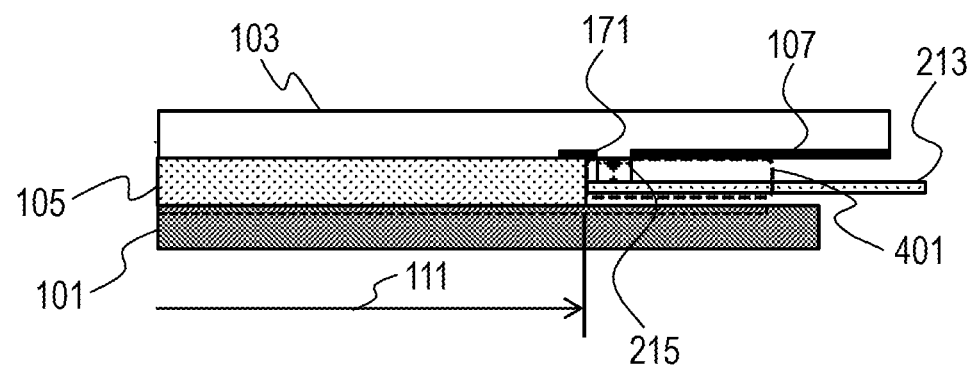
FIG. 7B is a cross-sectional diagram cut along the line A-A in FIG. 7A.

FIGS. 7A and 7B illustrate another example of the functional component and disposition thereof. The functional component is an example of a component. FIG. 7A is a plan diagram for illustrating the relation of the front panel 103, the light-blocking layer 107, the optically elastic resin layer 105, and the functional component 202. FIG. 7B is a cross-sectional diagram cut along the line A-A in FIG. 7A. In the following, differences from the configuration illustrated in FIGS. 2A, 2B, and 2C are mainly described.

In this example, the functional component 202 disposed in the space 401 is an external light sensor or a fingerprint sensor. The functional component 202 has a detector 215 mounted on the FPC 213. The detector 215 for the fingerprint sensor includes a light-emitting element and an element for detecting reflected light. Upsizing of the display device 10 can be prevented by providing the detector 215 in the proximity of the display region 111. The detector 215 is an element.

As illustrated in FIG. 7B, the detector 215 is provided on the face of the FPC 213 opposite to the front panel 103. As illustrated in FIG. 7A, the light-blocking layer 107 is provided to avoid the area opposite to the detector 215. The detector 215 detects external light or a fingerprint through an opening provided in the light-blocking layer 107.

The detector 215 may be in contact with or distant from the front panel 103. The detector 215 may be fixed to the front panel 103. The FPC 213 may be in contact with or distant from the display panel 101. The FPC 213 may be fixed to the display panel 101. The functional component 202 may be fixed to the display panel 101 or the front panel 103 before the display panel 101 and the front panel 103 are bonded together. The functional component 202 may be inserted in the space 401 after the display panel 101 and the front panel 103 are bonded together.

Figure 8A:
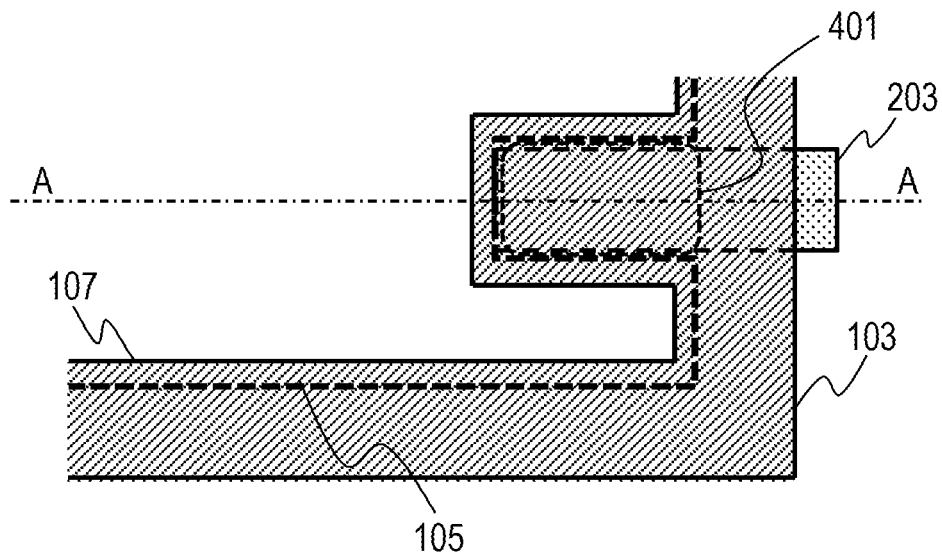
FIG. 8A illustrates still another example of the functional component and disposition thereof.
Figure 8B:
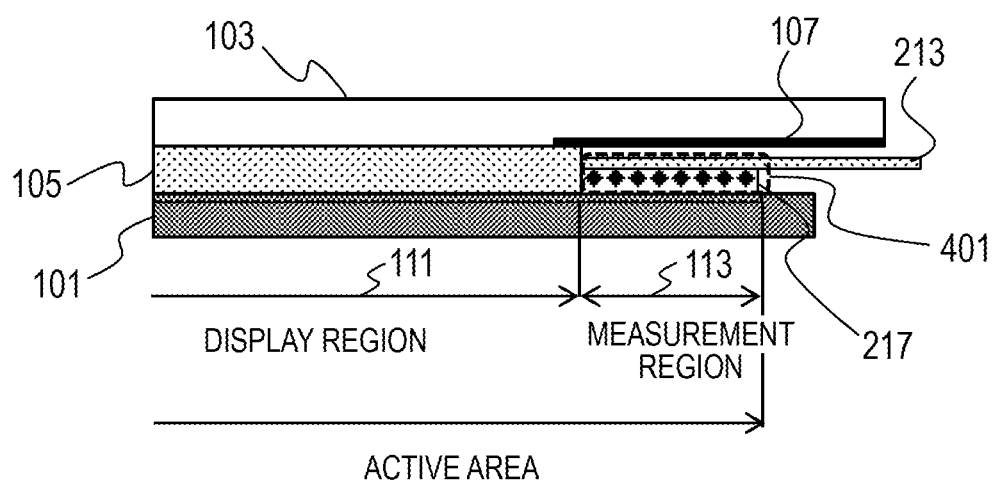
FIG. 8B is a cross-sectional diagram cut along the line A-A in FIG. 8A.

FIGS. 8A and 8B illustrate still another example of the functional component and disposition thereof. FIG. 8A is a plan diagram for illustrating the relation of the front panel 103, the light-blocking layer 107, the optically elastic resin layer 105, and a temperature sensor 203. FIG. 8B is a cross-sectional diagram cut along the line A-A in FIG. 8A. In the following, differences from the configuration illustrated in FIGS. 2A, 2B, and 2C are mainly described.

In this example, the functional component disposed in the space 401 is a temperature sensor 203. The temperature sensor 203 has a temperature detector (element) 217 mounted on the FPC 213. The temperature detector 217 is disposed to cover a part or substantially the entirety of the measurement region 113 in the space 401. The temperature detector 217 detects a temperature in the measurement region 113 or temperature distribution at a plurality of points in the measurement region 113. The controller 251 controls the displayed image in accordance with the measured value (s) of the temperature sensor 203. The temperature is a physical property.

As described above, some types of functional components can be provided in the space 401. The controller 251 of the functional component determines the control values for the display panel through a predetermined calculation using the value measured (detected) by the functional component. The controller 251 controls the display panel 101 (the displayed image) with the determined control values.

Figure 8C:
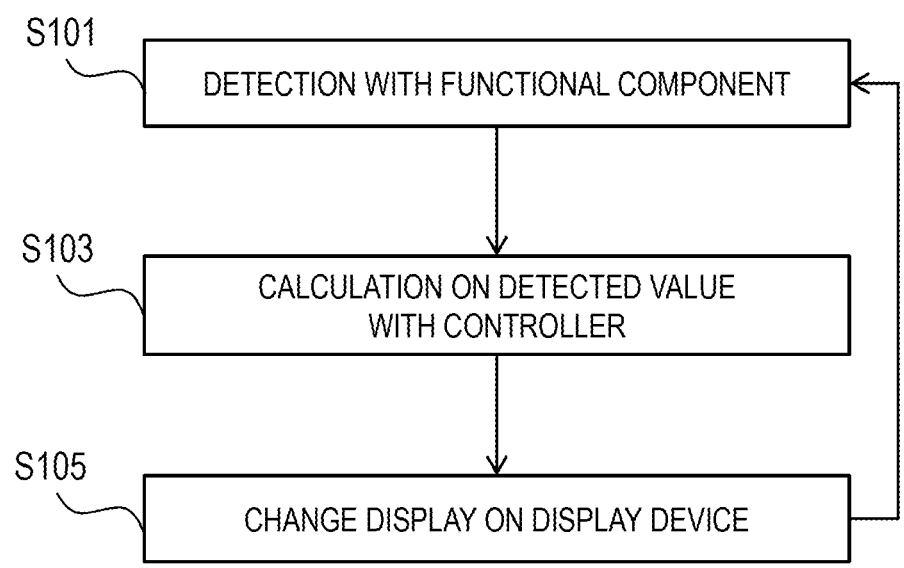
FIG. 8C is a flowchart of operation of the display device.

FIG. 8C is a flowchart of operation of the display device 10. The functional component detects the target to be detected (S101). The controller performs calculation on the detected value (S102) and changes the display on the display panel 101 based on the calculation result (S103). For example, the controller 251 controls the display panel 101 (the displayed image) based on the feedback of the value measured (detected) by the functional component. In an example, the controller 251 controls the luminance (monitor luminance) or the chromaticity of the display panel 101.

For example, the controller 251 acquires a value of the luminance of the display panel 101 (the pixels thereof) measured (detected) by the optical sensor 201, a value of the luminance of the external light measured (detected) by the external light sensor 202, or a value of the temperature of the display panel 101 measured (detected) by the temperature sensor 203. The controller 251 performs predetermined calculation on the acquired value, determines the control value to control the luminance of the display panel 101, and controls the display panel 101 with the determined value.

Specifically, in the case of detecting the luminance of the measurement region 113, the controller 251 adjusts the luminance of the display panel 101 so that the luminance of the measurement region will be uniform; in the case of detecting the luminance of the external light, the controller 251 adjusts the luminance of the display panel 101 depending on the brightness of the external light. In the case of detecting the chromaticity of the measurement region 113, the controller 251 adjusts the characteristics of the gradation and chromaticity by changing the luminosity levels and colors displayed in the measurement region to meet the characteristics of the image displayed in the display area 111. In the case of detecting the temperature in the measurement region 113, the controller 251 has data on variation in color tone and gradation characteristics with temperature and adjusts the chromaticity of the display panel 101 using a compensation coefficient for the detected temperature so that the chromaticity of the display panel 101 will be uniform.

In the case where the display panel 101 is a liquid crystal display panel, the controller 251 changes the monitor luminance by controlling the backlight current to change the backlight luminance. In the case where the display panel 101 is an OLED display panel, the controller 251 changes the monitor luminance by controlling the current supplied to the OLED elements.

The controller 251 may control the display panel 101 (the image to be displayed thereon) based on the detected fingerprint of the user. The controller 251 acquires information on the user's fingerprint from the functional component 202. The controller 251 identifies the user based on the fingerprint and displays an image suitable for the identified user. The controller 251 controls the displayed image in brightness, text size, and design, for example.

The functional component may include a plurality of detectors. For example, the functional component may detect the luminance of the display panel and the luminance of the external light. In the case where the detector is a temperature sensor or a fingerprint sensor, the functional component may simply have a sensing function to indicate a temperature or identify the operator, without performing the feedback control as illustrated in FIG. 8C. The functional component is not limited to the foregoing examples.

Figure 9A:
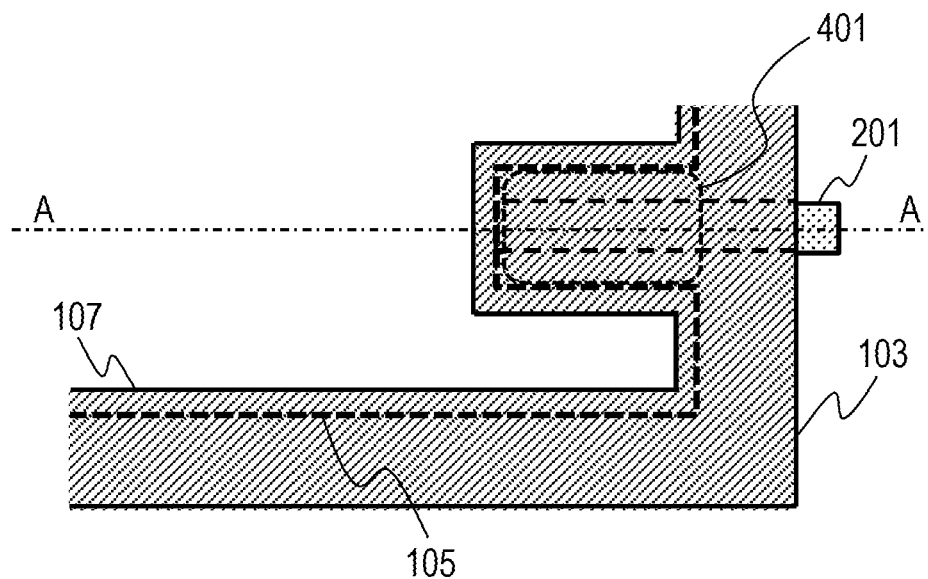
FIG. 9A schematically illustrates another example of the optically elastic resin layer.
Figure 9B:
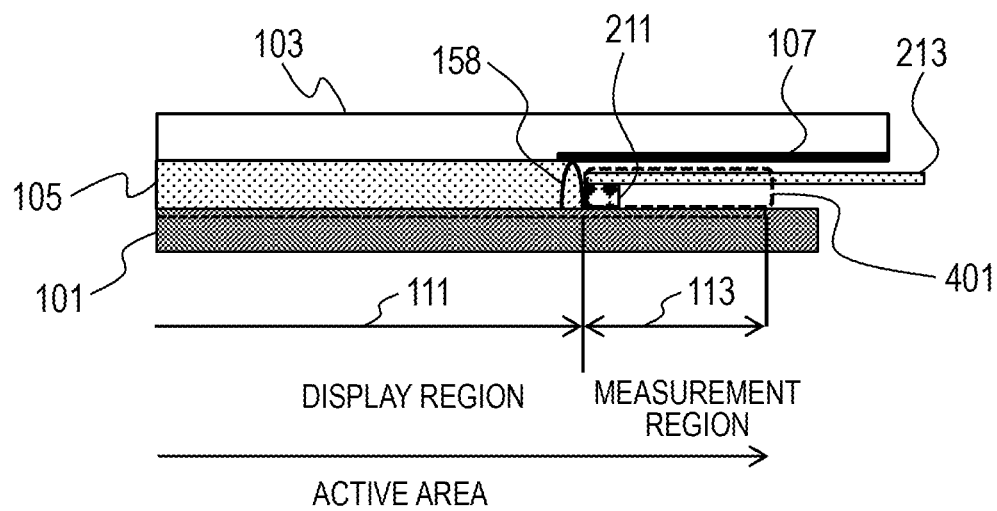
FIG. 9B is a cross-sectional diagram cut along the line A-A in FIG. 9A.

FIGS. 9A and 9B schematically illustrate another example of the optically elastic resin layer 105. FIG. 9A is a plan diagram for illustrating the relation of the front panel 103, the light-blocking layer 107, the optically elastic resin layer 105, and the optical sensor 201. FIG. 9B is a cross-sectional diagram cut along the line A-A in FIG. 9A. In the following, differences from the configuration illustrated in FIGS. 2A, 2B, and 2C are mainly described.

In this example, the optically elastic resin layer 105 is made of optically clear resin (OCR), which is a liquid resin that cures with UV light or heat. An example of a method of forming the OCR optically elastic resin layer 105 is described. The method first forms a dam 158 along the outline of the optically elastic resin layer 105 denoted by the dashed line in FIG. 9A. Forming the dam 158 applies OCR to the front face of the display panel 101 by dispensing application and simultaneously irradiates the OCR with spot UV light to temporarily cure the OCR into a gel so that the shape of the applied OCR does not change.

Next, the method applies OCR for bonding to the area defined by the dam. Subsequently, the method bonds the display panel 101 with the front panel under a decompressed environment, for example. Next, the method irradiates the OCR with spot UV light to temporarily cure the OCR and thereafter, irradiates the entire face with a predetermined amount of UV light to cure the OCR so that the front panel 103 and the display panel 101 are bonded together.

As illustrated in FIGS. 9A and 9B, a U-shaped dam 158 is exposed to the space 401 to partially define the space 401. The dam 158 facilitates forming an intended shape of space 401. The dam 158 can be made of resin of a kind different from the resin of the optically elastic resin layer 105 within the dam 158.

Figure 10A:
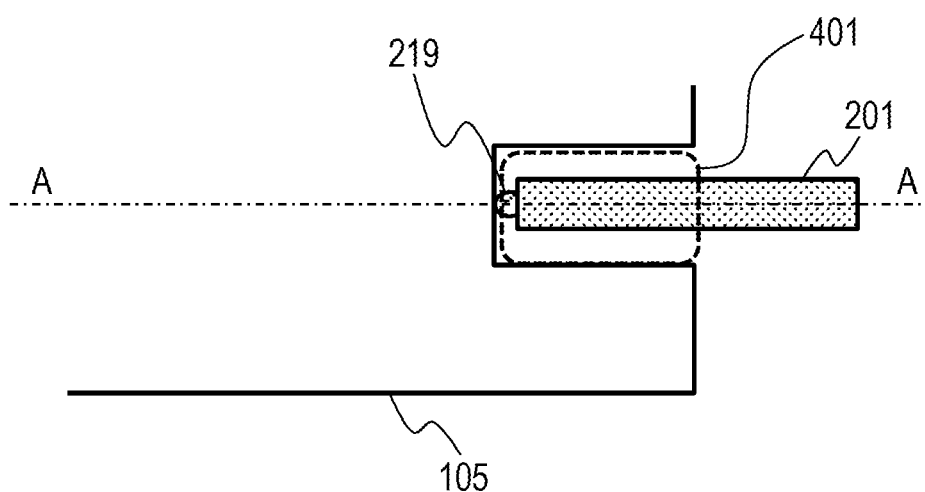
FIG. 10A illustrates another example of disposition of the functional component.
Figure 10B:
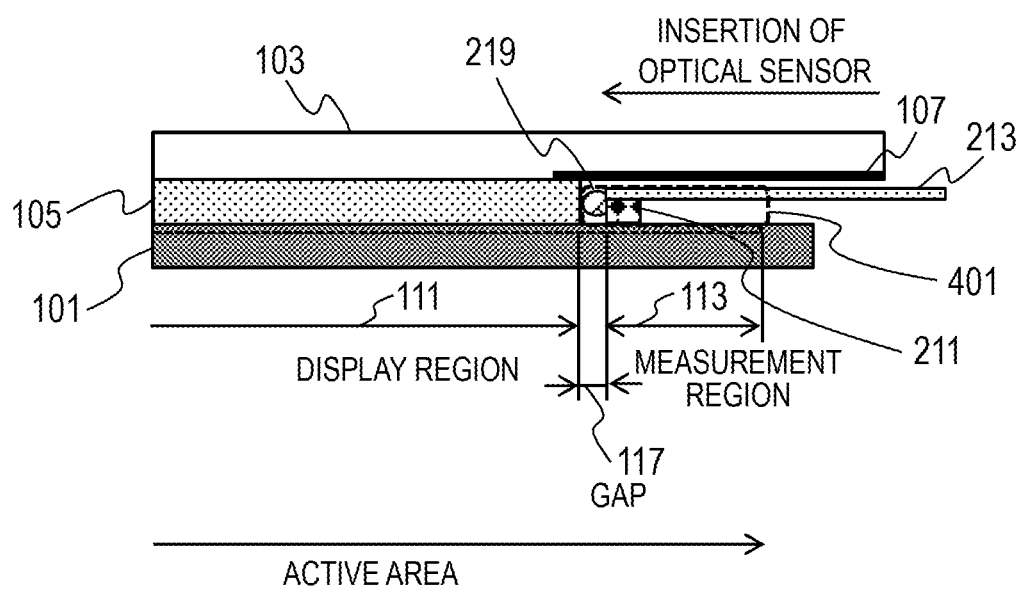
FIG. 10B is a cross-sectional diagram cut along the line A-A in FIG. 10A.

FIGS. 10A and 10B illustrate another example of disposition of the functional component. FIG. 10A is a plan diagram for illustrating the relation of the optically elastic resin layer 105 and an optical sensor 201. FIG. 10B is a cross-sectional diagram cut along the line A-A in FIG. 10A. In the following, differences from the configuration illustrated in FIGS. 2A, 2B, and 2C are mainly described.

A protector (elastic member) 219 is provided between the optical sensor 201 and the end face of the optically elastic resin layer 105. The protector 219 can be resin and its elasticity is lower than that of the optically elastic resin layer 105. The protector 219 reduces the deformation of the optically elastic resin layer 105 caused by contact of the optical sensor 201 with the optically elastic resin layer 105. As a result, the optically elastic resin layer 105 is prevented from peeling away from the front panel 103 or the display panel 101, not causing display defect.

The protector 219 is useful particularly for an optically elastic resin layer 105 having a small adhesive strength. For example, the adhesive strength of OCR is usually set from 0.1 to 0.5 N/mm$^2$ and therefore, the protector 219 is useful, compared to an OCA optically elastic resin layer 105.

The protector 219 is also useful particularly in the case where the optical sensor 201 is inserted into the space 401 after the front panel 103 and the display panel 101 are bonded together. As illustrated in FIG. 10B, the protector 219 is provided at the distal end in the direction of inserting the optical sensor 201. Even if the protector 219 touches the optically elastic resin layer 105 when the optical sensor 201 is inserted, the deformation of the optically elastic resin layer 105 will be smaller. For this reason, dimensional adjustment to produce a space in inserting the optical sensor 201 is not necessary, achieving a shorter assembling time. The optical sensor 201 can be removable.

The protector 219 may be provided at a place different from the one indicated in FIG. 10B. For example, the protector 219 can be provided on the optical sensor 201 in such a manner that the protector 219 will be located between the optically elastic resin layer 105 and the optically elastic resin layer 105 opposite to each other in the vertical direction in FIG. 10A. The optical sensor 201 can have a plurality of separate protectors 219.

Figure 11A:
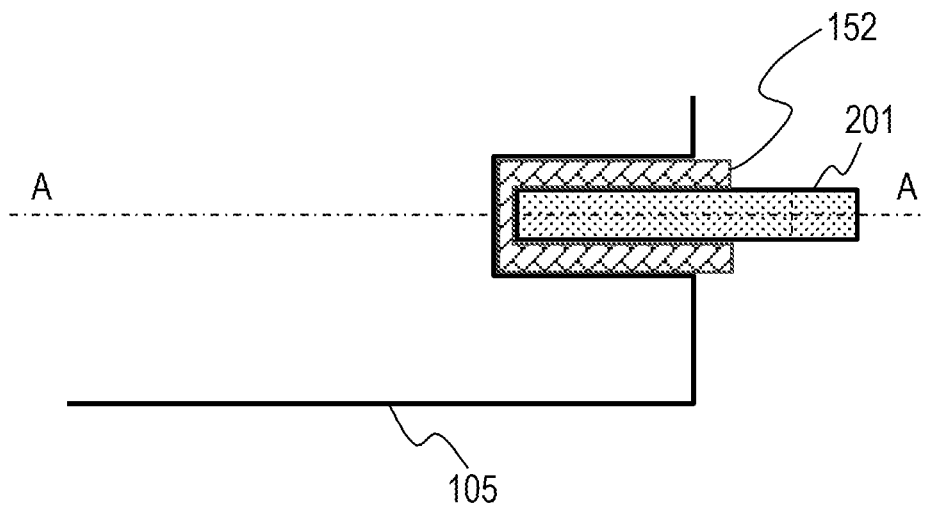
FIG. 11A illustrates still another example of disposition of the functional component.
Figure 11B:
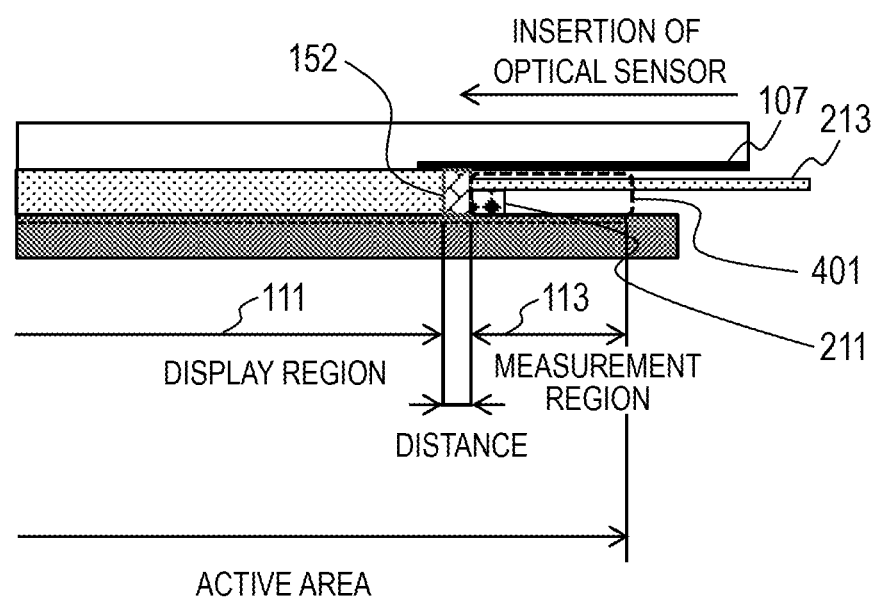
FIG. 11B is a cross-sectional diagram cut along the line A-A in FIG. 11A.

FIGS. 11A and 11B illustrate still another example of disposition of the functional component. FIG. 11A is a plan diagram for illustrating the relation of the optically elastic resin layer 105, a protector 152, and the optical sensor 201. FIG. 11B is a cross-sectional diagram cut along the line A-A in FIG. 11A. In the following, differences from the configuration illustrated in FIGS. 10A and 10B are mainly described.

In this example, a protector 152 for protecting the end face of the optically elastic resin layer 105 is provided between the optical sensor 201 and the optically elastic resin layer 105. The protector 152 is provided between the front panel 103 and the display panel 101, separately from the optical sensor 201. For example, manufacturing the display device 10 fixes the protector 152 onto the display panel 101 and then applies OCR to the display panel 101. Thereafter, the manufacturing bonds the front panel 103 with the display panel 101.

In the example of FIGS. 11A and 11B, the protector 152 is provided to cover the entire inner face of the indent 151 of the optically elastic resin layer 105. The protector 152 is exposed to the space 401 and prevents contact of the optical sensor 201 with the optically elastic resin layer 105 in the space 401.

The protector 152 is useful particularly in the case where the optical sensor 201 is inserted into the space 401 after the front panel 103 and the display panel 101 are bonded together. The optical sensor 201 can be removable from the protector 152. This configuration facilitates replacement of the optical sensor 201.

Figure 12A:
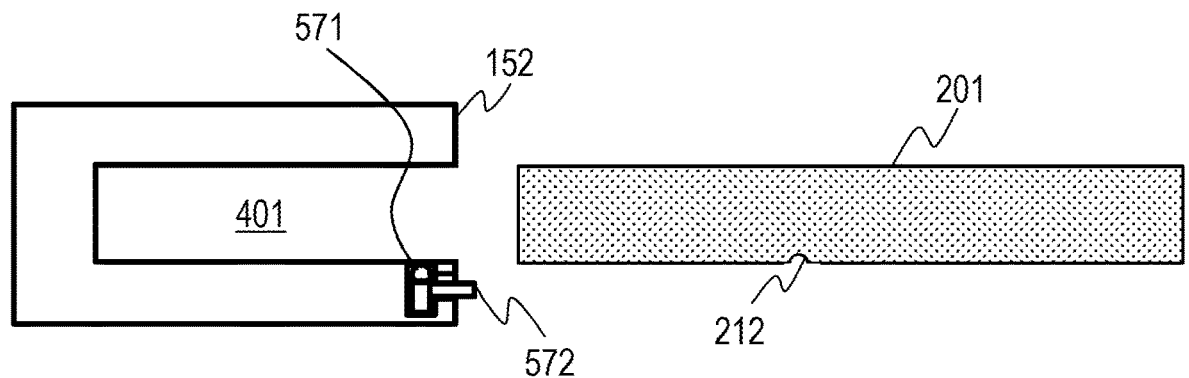
FIG. 12A illustrates a configuration example of a protector having a socket mechanism.
Figure 12B:
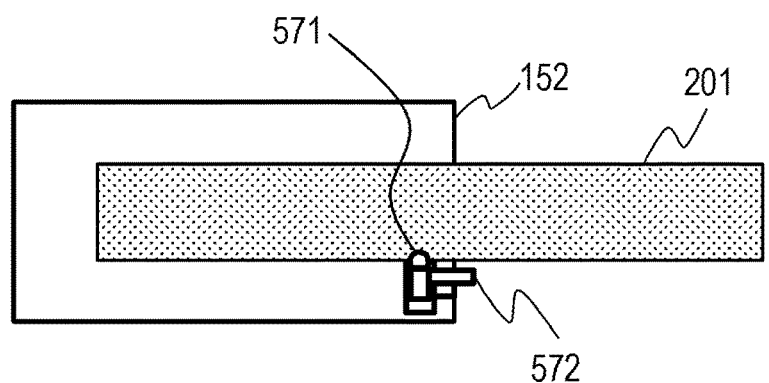
FIG. 12B illustrates a configuration example of a protector having a socket mechanism.

FIGS. 12A and 12B illustrate a configuration example of a protector 152 having a socket mechanism. The optical sensor 201 is removable from the protector 152. FIG. 12A illustrates an example of a state where the optical sensor 201 has been removed from the protector 152. FIG. 12B illustrates an example of a state where the optical sensor 201 is fit in the protector 152.

The protector 152 can be made of resin. The protector 152 has a fixing lug 571 and a fixing tab 572. The optical sensor 201 has a groove 212 to engage with the fixing lug 571. When the optical sensor 201 is fit in the protector 152, the fixing lug 571 engages with the groove 212 to prevent the optical sensor 201 from leaving the protector 152 (a locked state).

The user (including a serviceperson) inserts the optical sensor 201 into the protector 152 (the space 401 in the protector 152) and slides the fixing tab 572 to set the fixing lug 571 into the groove 212 of the optical sensor 201 (a locked state).

To remove the optical sensor 201, the user (including a serviceperson) slides the fixing tab 572. When the fixing tab 572 is operated, the fixing lug 571 disengages from the groove 212 of the optical sensor 201 (a release state). The optical sensor 201 becomes removable from the protector 152.

Figure 13A:
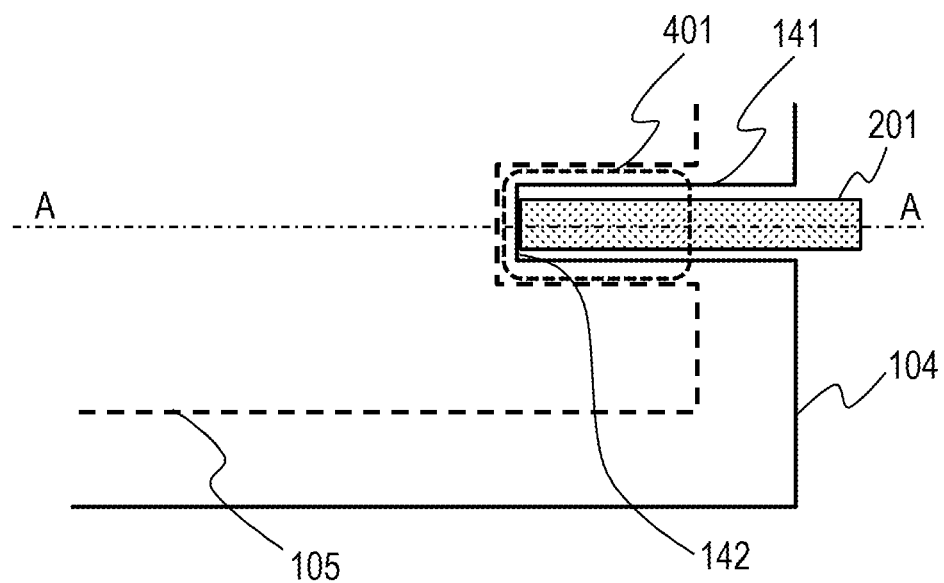
FIG. 13A illustrates another configuration example of the display device.
Figure 13B:
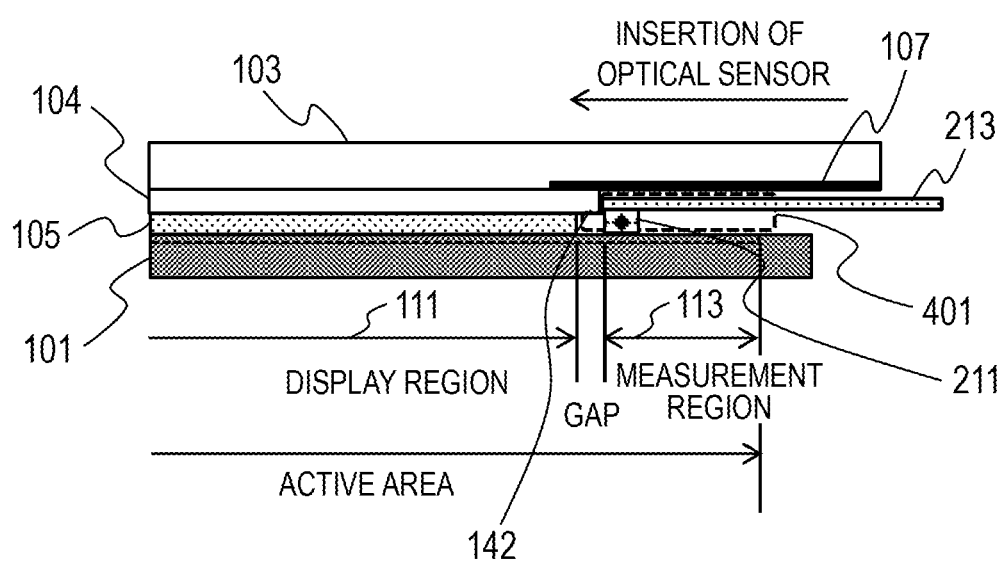
FIG. 13B is a cross-sectional diagram cut along the line A-A in FIG. 13A.

FIGS. 13A and 13B illustrate another configuration example of the display device 10. The display device 10 has an intermediate panel 104 between the front panel and the display panel 101. The intermediate panel 104 is partially exposed to the space 401 to function as a stopper. The stopper is provided to be in contact with the optical sensor 201 to keep the optical sensor 201 off the optically elastic resin layer 105. As a result, contact of the optically elastic resin layer 105 with the optical sensor 201 is prevented.

FIG. 13A is a plan diagram for illustrating the relation of the intermediate panel 104, the optically elastic resin layer 105, and the optical sensor 201. FIG. 13B is a cross-sectional diagram cut along the line A-A in FIG. 13A. The intermediate panel 104 has an indent (cut-out) 141 overlapped with the indent 151 of the optically elastic resin layer 105 in the stacking direction. The intermediate panel 104 can be a transparent panel and can have a planar shape identical to or different from the front panel 103 in the part other than the indent 141. The intermediate panel 104 and the front panel 103 are bonded together with an adhesive, for example.

The peripheral part (end part) around the indent 141 of the intermediate panel 104 includes a stopper 142 to prevent contact of the optically elastic resin layer 105 with the optical sensor 201. In this example, the optical sensor 201 is inserted from the opening of the space 401 into the space 401. The stopper 142 is a part opposite to the opening of the space 401 in the direction of insertion of the optical sensor 201 (in the direction from the right to the left in FIGS. 13A and 13B).

The stopper 142 is projected more than the end face of the optically elastic resin layer 105 and exposed to the space 401. The thickness of the stopper 142 (the intermediate panel 104) takes a value larger than the value obtained by subtracting the thickness of the optical sensor 201 from the distance between the display panel 101 and the front panel 103 (the height of the space 401). The stopper 142 comes in contact with the inserted optical sensor 201 within the space 401 at a position far away from the optically elastic resin layer 105. As a result, contact of the optically elastic resin layer 105 with the optical sensor 201 is prevented.

When the optical sensor 201 is inserted into the space 401, the optical sensor 201 is pressed against the stopper 142 and does not go further any more. A gap is generated between the optically elastic resin layer 105 and the optical sensor 201 so that the optical sensor 201 can be mounted without contact with the optically elastic resin layer 105. As a result, display defect caused by deformation or peel-off of the optically elastic resin layer 105 is prevented. Accordingly, the stopper 142 is a kind of protector for protecting the optically elastic resin layer 105.

In this example, the peripheral part (end part) around the indent 141 of the intermediate panel 104 is projected into the space 401 more than the optically elastic resin layer 105, also in the part other than the stopper 142. The end part of the intermediate panel 104 exposed to the space 401 has a U-shape when seen in the stacking direction. This part other than the stopper 142 in the end part also functions as a protector for the optically elastic resin layer 105.

The part other than the stopper 142 also functions as a guide during insertion of the optical sensor 201 into the space 401 so that the optical sensor 201 will not be obliquely inserted into the space 401 to guide the optical sensor 201 to the optimum position.

In the end part of the intermediate panel 104 exposed to the space 401, the part other than the stopper 142 opposite to the opening of the space 401 from which the optical sensor 201 is inserted (the part along the direction of insertion) does not have to be projected into the space 401 but can be flush with the end face of the optically elastic resin layer 105.

The structure of this example is also applicable to a manufacturing method that mounts the optical sensor 201 first and then bonds the front panel 103 with the display panel 101, instead of inserting the optical sensor 201 into the space 401 afterwards, and the display device manufactured by this method. The stopper can be provided on the back face of front panel 103. The stopper can be formed by providing an indent (non-through hole) on the back face of the front panel 103. In this configuration, the intermediate panel 104 is omitted.

Figure 14A:
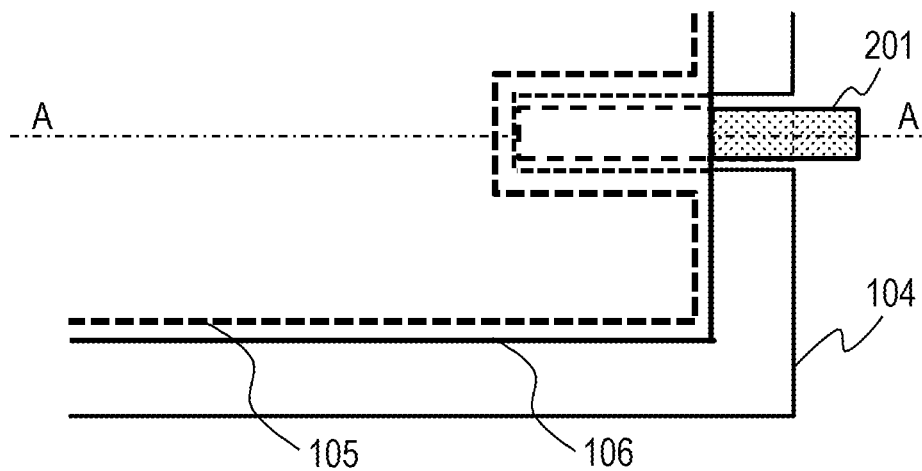
FIG. 14A illustrates a configuration example of a display device having a touch panel function.
Figure 14B:
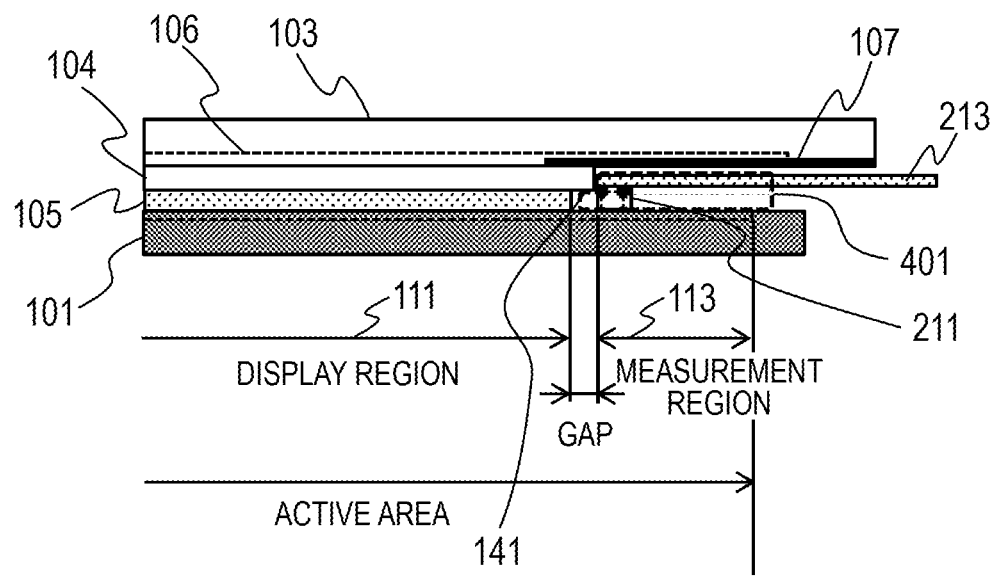
FIG. 14B is a cross-sectional diagram cut along the line A-A in FIG. 14A.

FIGS. 14A and 14B illustrate a configuration example of a display device 10 having a touch panel function. The display device 10 has a touch panel pattern 106 on the front panel 103. The touch panel pattern 106 is an electrode pattern for providing the touch panel function. The remaining is the same as the configuration illustrated in FIGS. 13A and 13B. The characteristic configuration of this disclosure is applicable to the display device having a touch panel function. The touch panel pattern may be provided on the intermediate panel 104 or the display panel 101.

Figure 15A:
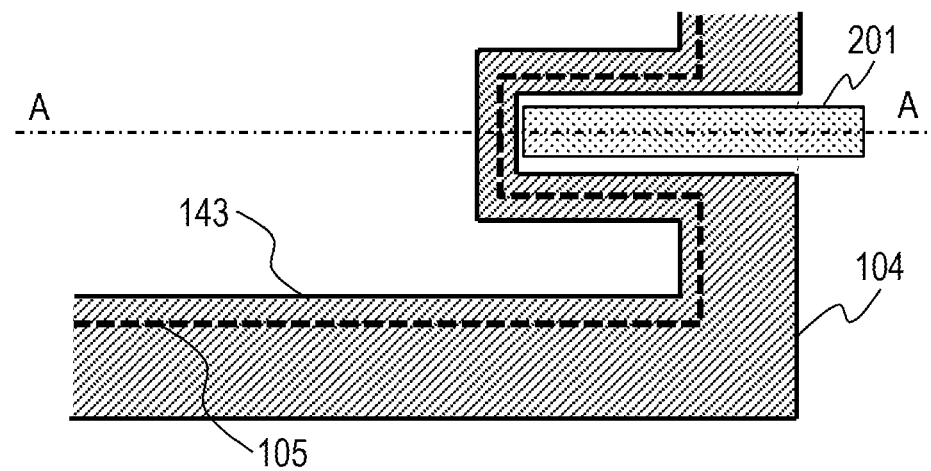
FIG. 15A illustrates an example of a light-blocking layer provided on the intermediate panel.
Figure 15B:
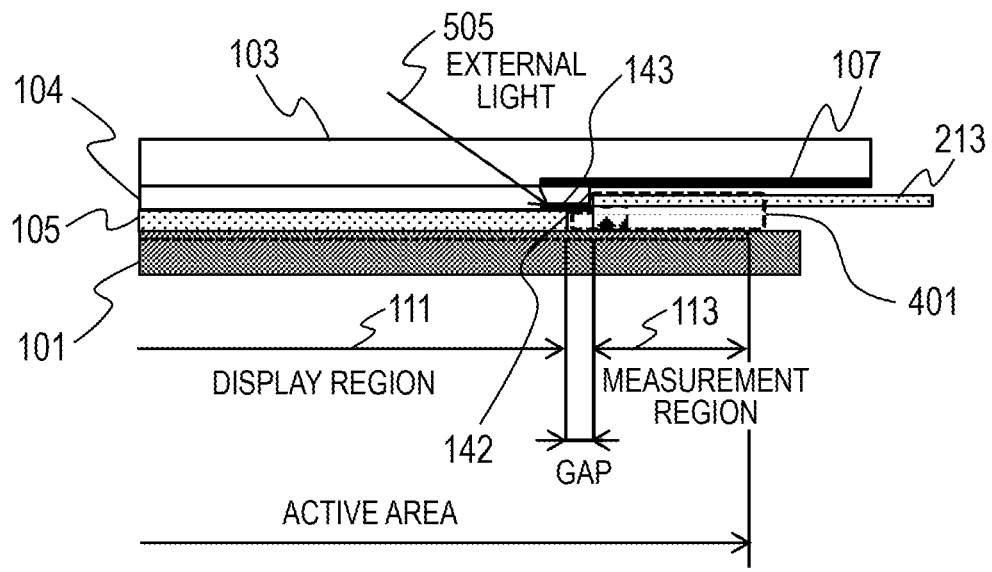
FIG. 15B is a cross-sectional diagram cut along the line A-A in FIG. 15A.

Hereinafter, examples of light-blocking layers provided in a display device are described. FIGS. 15A and 15B illustrate an example of a light-blocking layer 143 provided on the intermediate panel 104. FIG. 15A is a plan diagram for illustrating the relation of the intermediate panel 104, the light-blocking layer 143, the optically elastic resin layer 105, and the optical sensor 201. FIG. 15B is a cross-sectional diagram cut along the line A-A in FIG. 15A. In the following, differences from the configuration example illustrated in FIGS. 13A and 13B are mainly described.

As illustrated in FIG. 15B, the intermediate panel 104 has a light-blocking layer 143 on the back face thereof. As illustrated in FIG. 15A, the light-blocking layer 143 is provided around the entire rim of the back face of the intermediate panel 104. The inner periphery of the light-blocking layer 143 matches the inner periphery of the light-blocking layer 107 provided on the back face of the front panel 103 when seen in the stacking direction. The light-blocking layer 143 of the intermediate panel 104 can block more external light 505 to enter the photodetector 211. Further, the light-blocking layer 143 interferes with the user seeing the light from the pixels in the measurement region 113.

Figure 16A:
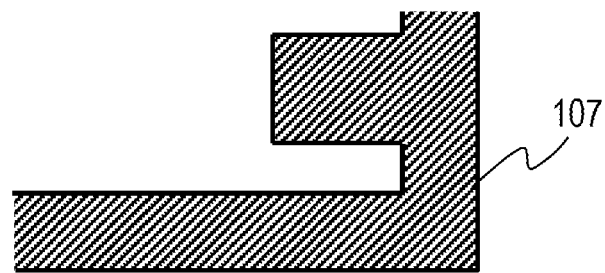
FIG. 16A illustrates a shape of the light-blocking layer of the front panel and a shape of the light-blocking layer of the intermediate panel.
Figure 16A:
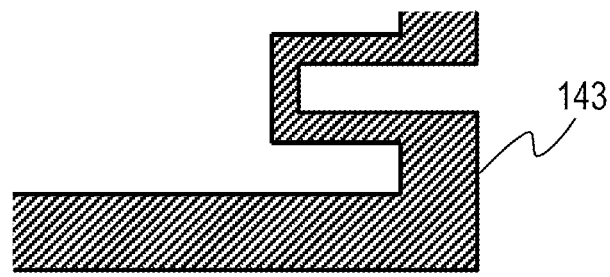

FIG. 16A illustrates a shape of the light-blocking layer 107 of the front panel 103 and a shape of the light-blocking layer 143 of the intermediate panel 104. In the example of FIG. 16A, the light-blocking layer 143 is provided around the entire periphery of the intermediate panel 104 along the area of the light-blocking layer 107 of the front panel 103. The inner periphery of the light-blocking layer 143 matches the inner periphery of the light-blocking layer 107 when seen in the stacking direction. These inner peripheries do not have to match each other.

Figure 16B:
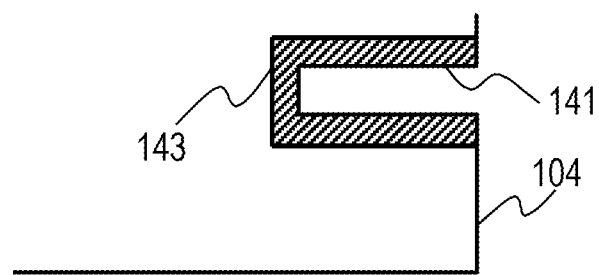
FIG. 16B illustrates another example of the shape of the light-blocking layer of the intermediate panel.

FIG. 16B illustrates another example of the shape of the light-blocking layer 143. The light-blocking layer 143 is provided only around the indent 141 of the intermediate panel 104. The light-blocking layer 143 having this shape can also reduce the external light to enter the photodetector 211 provided in the space 401. Furthermore, the light-blocking layer 143 interferes with the user seeing the light of the pixels in the measurement region 113.

The light-blocking layers 107 and 143 provided on the back faces of the front panel 103 and the intermediate panel 104 have good light-blocking effect for the photodetector 211. The light-blocking layers may be provided on the front faces of the front panel 103 and the intermediate panel 104.

Figure 17A:
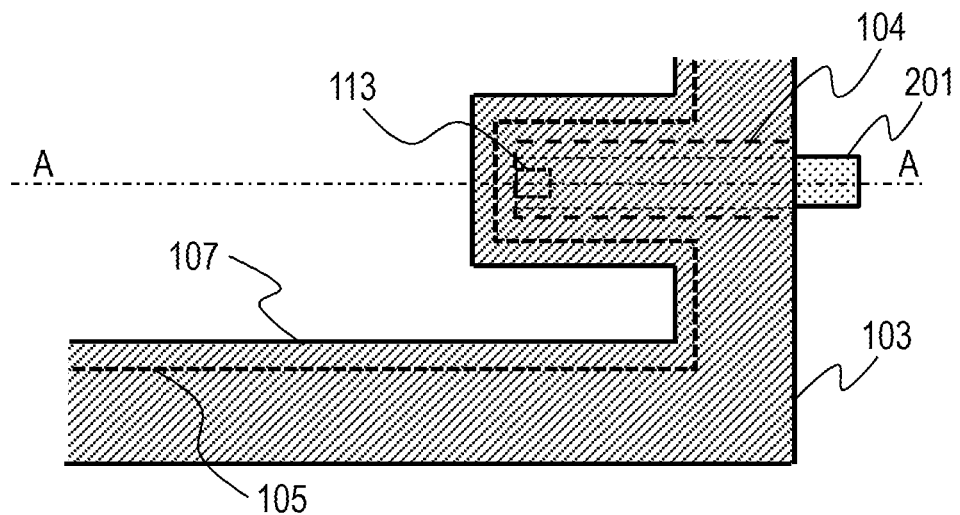
FIG. 17A illustrates an example of a light-blocking layer provided on the display panel.
Figure 17B:
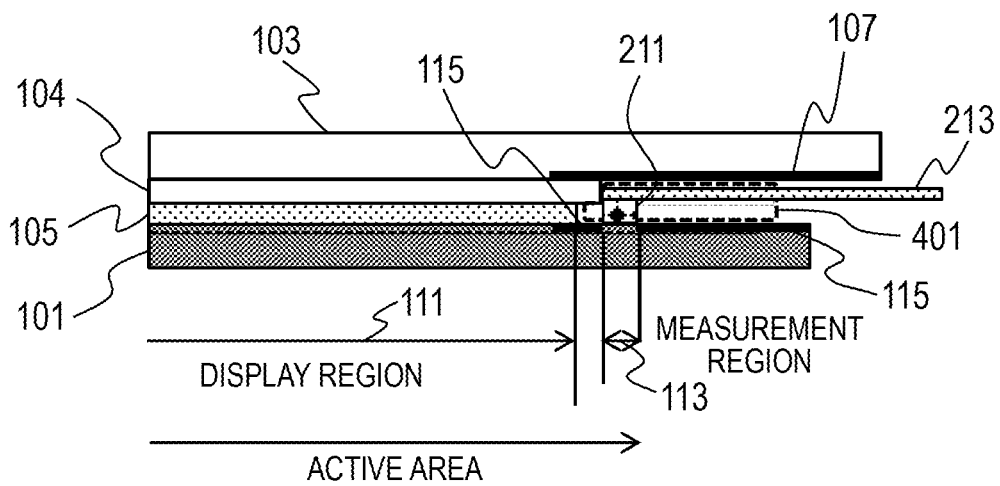
FIG. 17B is a cross-sectional diagram cut along the line A-A in FIG. 17A.

FIGS. 17A and 17B illustrate an example of a light-blocking layer 115 provided on the display panel 101. FIG. 17A is a plan diagram for illustrating the relation of the front panel 103, the intermediate panel 104, the light-blocking layer 107, the optically elastic resin layer 105, the measurement region 113, and the optical sensor 201. FIG. 17B is a cross-sectional diagram cut along the line A-A in FIG. 17A. In the following, differences from the configuration example illustrated in FIGS. 13A and 13B are mainly described.

As illustrated in FIG. 17B, the display panel 101 has a light-blocking layer 115 on the front face thereof. The light-blocking layer 115 is provided on the face of the display panel 101 exposed to the space 401. The light-blocking layer 115 is provided outside of the measurement region 113. The photodetector 211 detects the light in the measurement region 113 where the light-blocking layer 115 is not provided. The light-blocking layer 115 reduces the external light incident on the photodetector 211 because of the inner reflection of the display region 111.

Figure 18A:
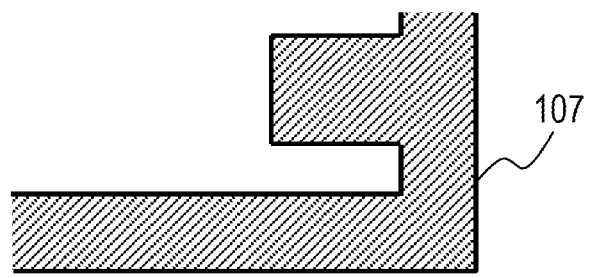
FIG. 18A illustrates a shape of the light-blocking layer of the front panel and a shape of the light-blocking layer of the display panel.
Figure 18A:
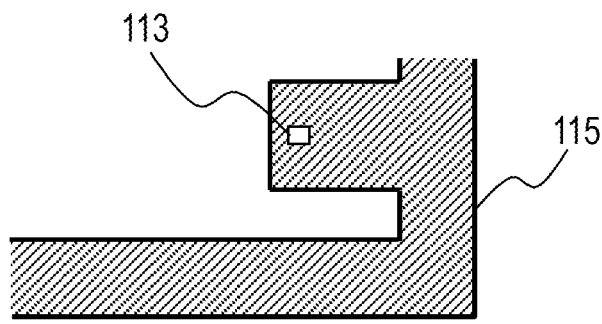

FIG. 18A illustrates a shape of the light-blocking layer 107 of the front panel 103 and a shape of the light-blocking layer 115 of the display panel 101. In the example of FIG. 18A, the light-blocking layer 115 is provided around the entire periphery of the display panel 101 along the area of the light-blocking layer 107 of the front panel 103. The inner periphery of the light-blocking layer 115 matches the inner periphery of the light-blocking layer 107 when seen in the stacking direction. These inner peripheries do not have to match each other.

In the example of FIG. 18A, the light-blocking layer 115 covers the entire area excluding the measurement region 113 in the face of the display panel 101 exposed to the space 401. This configuration more effectively reduces the external light incident on the photodetector 211. Some part of the area excluding the measurement region 113 in the face of the display panel 101 exposed to the space 401 does not have to be covered with the light-blocking layer 115.

Figure 18B:
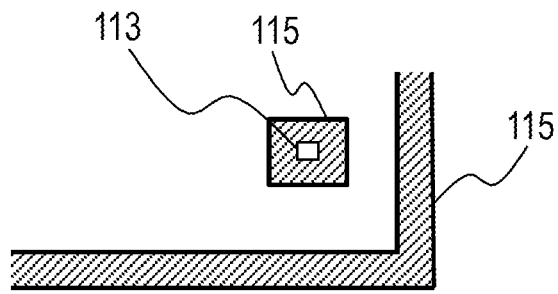
FIG. 18B illustrates another example of the shape of the light-blocking layer of the display panel.

FIG. 18B illustrates another example of the shape of the light-blocking layer 115. The light-blocking layer 115 has a rim region of the display panel 101 and an island region distant from the rim region. The island region has an open area where the light-blocking layer 115 does not exist. This open area corresponds to the measurement region 113. In this example, the shape of the light-blocking layer 115 surrounding the measurement region 113 is a rectangle.

In the face of the display panel 101 exposed to the space 401, the light-blocking layer 115 is provided only around the measurement region 113. Part of the area excluding the measurement region 113 is not covered with the light-blocking layer 115. The island region of the light-blocking layer 115 also reduces the external light incident on the photodetector 211 in the space 401. The display device 10 may have both of the light-blocking layer 115 of the display panel 101 and the light-blocking layer 143 of the intermediate panel 104.

Figure 19A:
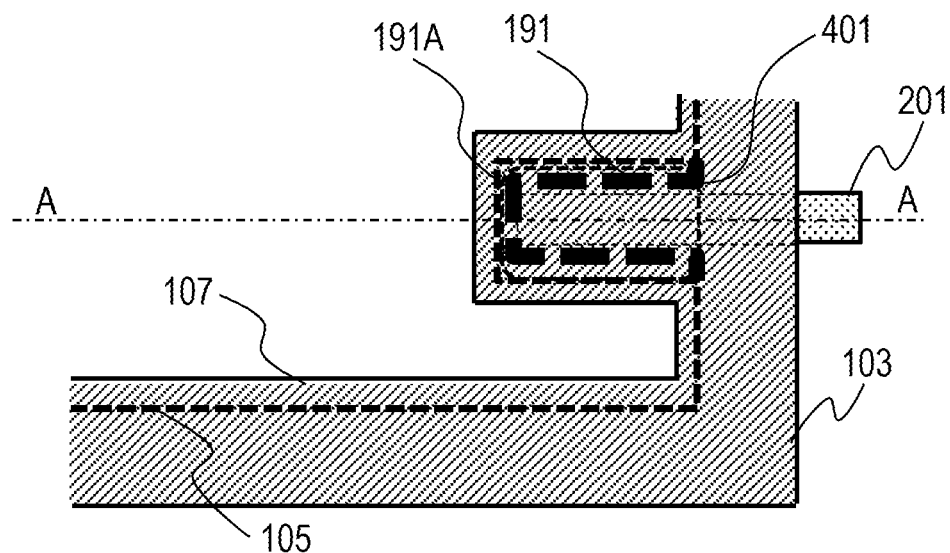
FIG. 19A illustrates another configuration example of the stopper for stopping insertion of the functional component.
Figure 19B:
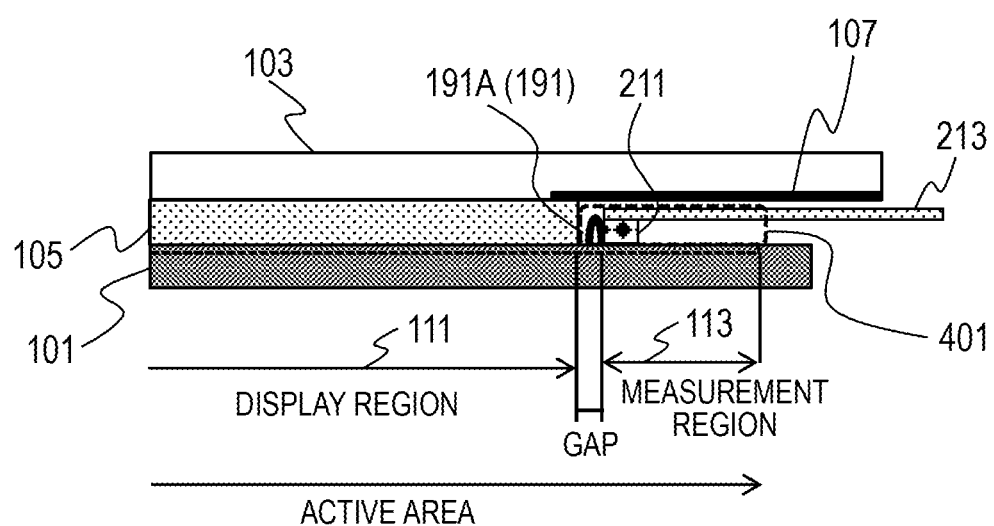
FIG. 19B is a cross-sectional diagram cut along the line A-A in FIG. 19A.

FIGS. 19A and 19B illustrate another configuration example of the stopper for stopping insertion of the functional component. FIG. 19A is a plan diagram for illustrating the relation of the front panel 103, the light-blocking layer 107, the optically elastic resin layer 105, a wall 191 including a stopper 191A, and the optical sensor 201. FIG. 19B is a cross-sectional diagram cut along the line A-A in FIG. 19A. In the following, differences from the configuration example illustrated in FIGS. 2A, 2B, and 2C are mainly described.

The wall 191 including the stopper 191A is provided on the front face of the display panel 101 within the space 401. In the space 401, the wall 191 is provided along the indent 151 of the optically elastic resin layer. There is a gap between the wall 191 and the optically elastic resin layer 105. The wall 191 is provided in a shape having one open side (namely, a U-shape) and have an opening to insert the optical sensor 201 into the space 401.

This opening is included in the opening of the indent 151 of the optically elastic resin layer 105. The height of the wall 191 (the dimension in the stacking direction) can take a value equal to or more than the value obtained by subtracting the thickness of the optical sensor 201 from the height of the space 401, for example, and does not exceed the height of the space 401.

The wall 191 is formed by applying and curing liquid resin, for example. In an example, the wall 191 is made of resin having elasticity higher (harder) than that of the optically elastic resin layer 105 or the same material as the optically elastic resin layer 105. The wall 191 may be formed of a material different from resin or by a method different from the above-described method. The wall 191 may be made of resin having elasticity higher (harder) than that of the optically elastic resin layer 105 and in contact with the optically elastic resin layer 105.

The stopper 191A is a part of the wall 191 and is the part opposite to the opening from which the optical sensor 201 is inserted. The inserted optical sensor 201 comes in contact with the stopper 191A at a position far away from the optically elastic resin layer 105 in the space 401. As a result, contact of the optical sensor 201 with the optically elastic resin layer 105 is prevented.

When the optical sensor 201 is inserted into the space 401, the optical sensor 201 is pressed against the stopper 191A and does not go further any more. A gap is generated between the optically elastic resin layer 105 and the optical sensor 201 so that the optical sensor 201 can be mounted without contact with the optically elastic resin layer 105. As a result, display defect caused by deformation or peel-off of the optically elastic resin layer 105 is prevented. Accordingly, the stopper 191A is a kind of protector for protecting the optically elastic resin layer 105.

In this example, the wall 191 exists between the optically elastic resin layer 105 and the optical sensor 201 even in the area not for the stopper 191A. The part of the wall 191 except for the stopper 191A also functions as the protector for the optically elastic resin layer 105.

The part of the wall 191 except for the stopper 191A can be omitted. The structure of this example is also applicable to a manufacturing method that mounts the optical sensor 201 first and then bonds the front panel 103 with the display panel 101, instead of inserting the optical sensor 201 into the space 401 afterwards, and the display device manufactured by the method.

Figure 20A:
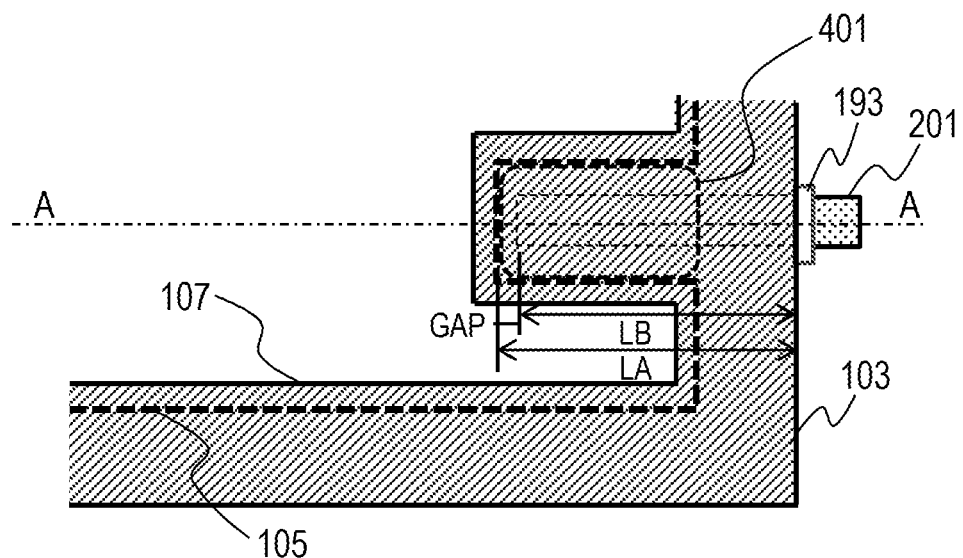
FIG. 20A illustrates still another configuration example of the stopper for stopping insertion of the functional component.
Figure 20B:
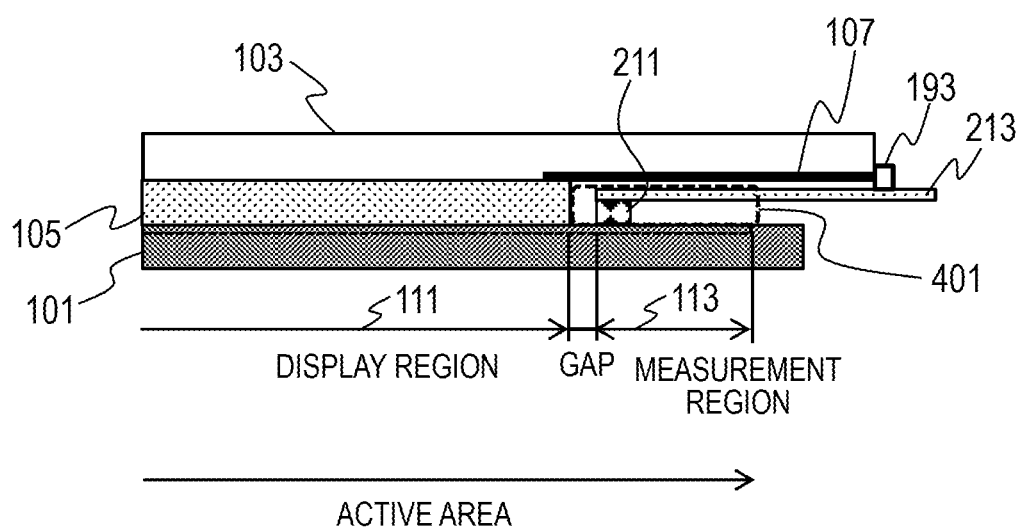
FIG. 20B is a cross-sectional diagram cut along the line A-A in FIG. 20A.

FIGS. 20A and 20B illustrate still another configuration example of the stopper for stopping insertion of the functional component. FIG. 20A is a plan diagram for illustrating the relation of the front panel 103, the light-blocking layer 107, the optically elastic resin layer 105, and an optical sensor 201 having a stopper 193. FIG. 20B is a cross-sectional diagram cut along the line A-A in FIG. 20A. In the following, differences from the configuration example illustrated in FIGS. 2A, 2B, and 2C are mainly described.

The stopper 193 is provided on the front face of the FPC 213 and comes in contact with the end face of the front panel 103. The length LB from the stopper 193 to the distal end of the FPC 213 is shorter than the distance LA from the end face of the front panel 103 to the end face of the optically elastic resin layer 105 exposed to the space 401.

When the optical sensor 201 is inserted into the space 401, the stopper 193 is pressed against the end face of the front panel 103, so that the optical sensor 201 does not go further any more. A gap is generated between the optically elastic resin layer 105 and the optical sensor 201 so that the optical sensor 201 can be mounted without touching the optically elastic resin layer 105. As a result, display defect caused by deformation or peel-off of the optically elastic resin layer 105 is prevented.

Making the stopper 193 come in contact with the front panel 103 eliminates influence of the optical sensor 201 on the display panel 101 in insertion of the optical sensor 201. The stopper 193 is made of resin, for example. The stopper 193 may be provided on the back face of the FPC 213 and pressed against the end face of the display panel 101.

As described above, forming the optically elastic resin layer 105 to avoid the space 401 between the display panel 101 and the front panel 103 and placing the functional component in the space 401 eliminate the influence of the functional component on the optically elastic resin layer 105, preventing degradation in display quality and function of the functional component.

In the configuration where the optically elastic resin layer is provided between the detector and the display panel or the front panel, if bubbles exist in the optically elastic resin layer, accurate measurement with the detector is difficult. Providing the detector in a space where the optically elastic resin layer does not exist enables measurement of a physical property such as luminance or temperature without influence of the optically elastic resin layer.

Figure 21A:
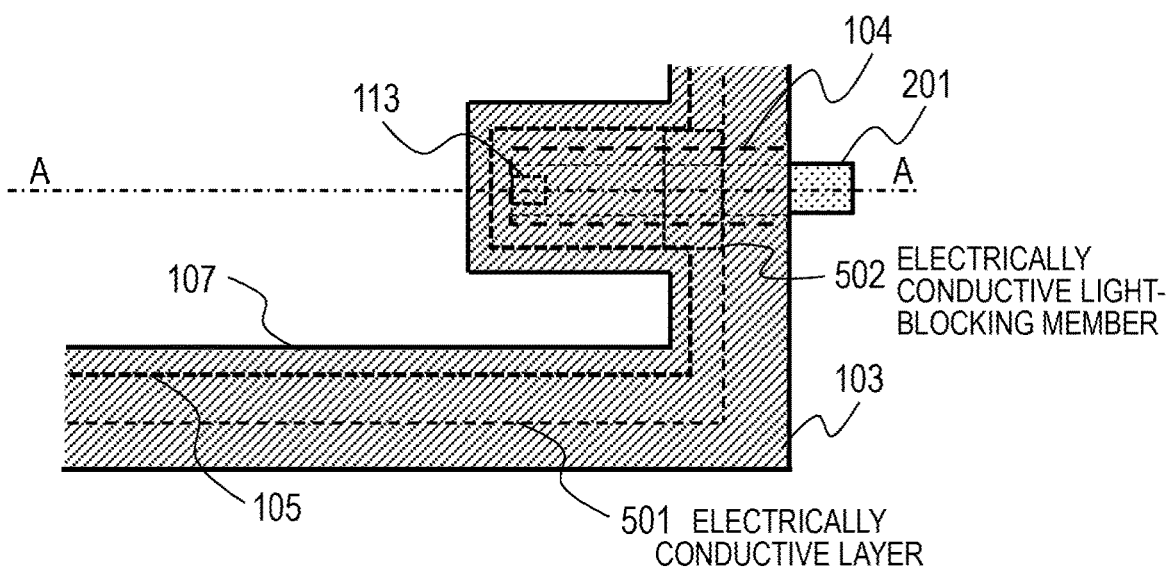
FIG. 21A is a plan diagram for illustrating a relation of the front panel, the display panel, the optically elastic resin layer, the intermediate panel, and the optical sensor including an FPC.
Figure 21B:
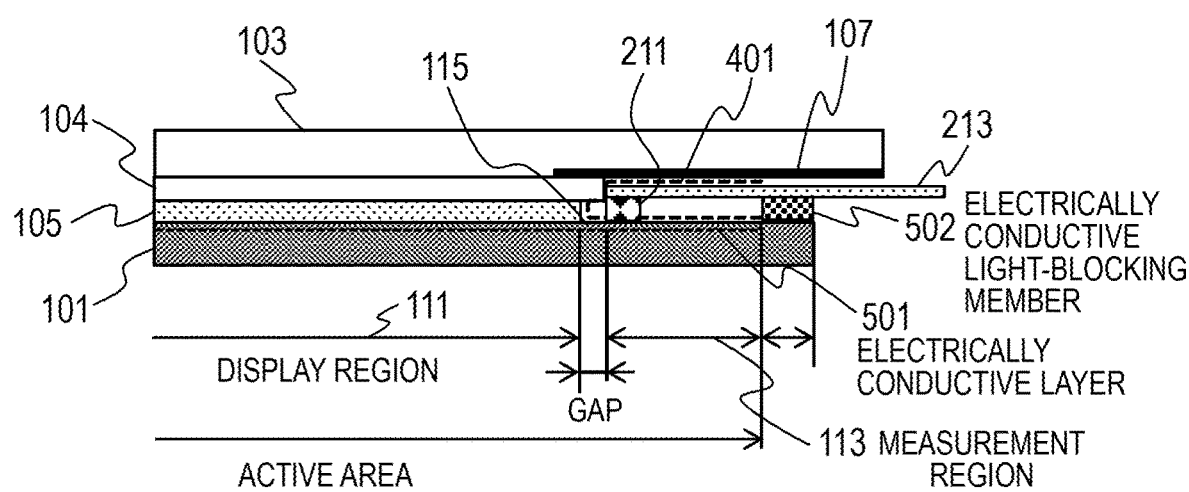
FIG. 21B is a cross-sectional diagram cut along the line A-A in FIG. 21A.

FIGS. 21A and 21B illustrate a configuration example including an electrically conductive light-blocking member 502 having light-blocking effect so that external light will not enter the space 401 from the virtual face 157/159 and electrical conductivity for electrically connecting the surface of the display panel 101 to the FPC 213.

FIG. 21A is a plan diagram for illustrating the relation of the front panel 103, the display panel 101, the optically elastic resin layer 105, the intermediate panel 104, and the optical sensor 201 including an FPC 213. FIG. 21B is a cross-sectional diagram cut along the line A-A in FIG. 21A. In the following, differences from the configuration example illustrated in FIGS. 17A and 17B are mainly described.

The display panel 101 has an electrically conductive layer 501 for preventing the display panel 101 from malfunctioning because of its electrification. For example, in the case where the display panel 101 is an in-plane switching type of liquid crystal panel, a transparent conductive film of ITO or IZO is provided on the entire active area.

Figure 21C:
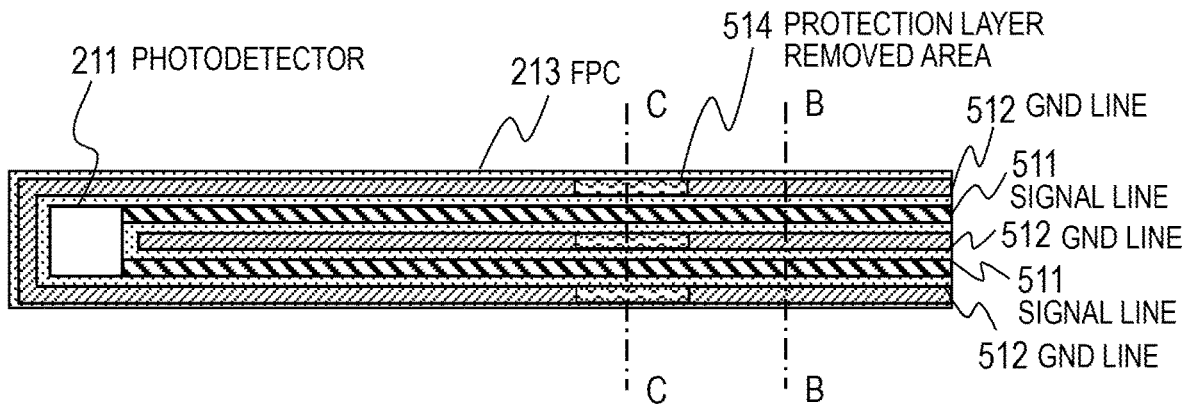
FIG. 21C is a plan diagram for schematically illustrating the FPC with a photodetector mounted thereon.
Figure 21D:
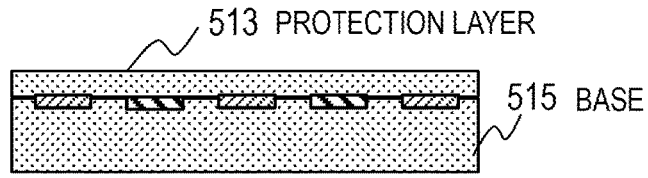
FIG. 21D is a cross-sectional diagram cut along the line B-B in FIG. 21C.
Figure 21E:
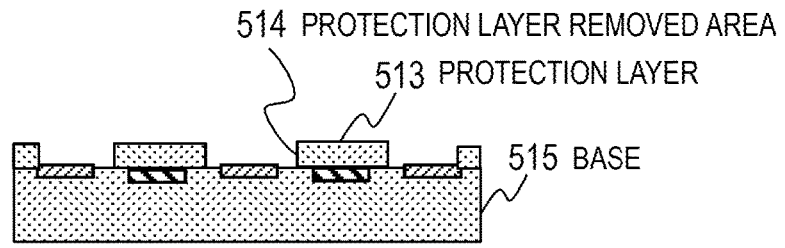
FIG. 21E is a cross-sectional diagram cut along the line C-C in FIG. 21C.

FIG. 21C is a plan diagram for schematically illustrating the FPC 213 with a photodetector 211 mounted thereon. FIGS. 21D and 21E are cross-sectional diagrams cut along the line B-B and the line C-C, respectively, in FIG. 21C.

The FPC 213 has GND lines 512 at an electrically ground level, in addition to signal lines 511 for transmitting detection signals of the photodetector 211 to the controller 251. The signal lines 511 and the GND lines 512 are sandwiched between a base 515 and a protection layer 513. The protection layer 513 is opposite to the electrically conductive layer 501; that is to say, the protection layer 513 is located between the base 515 and the electrically conductive layer 501.

The protection layer 513 is partially removed in areas 514. In the areas (protection layer removed areas) 514 where the protection layer 513 is removed, the GND lines 512 are exposed and the signal lines 511 are not exposed. In the areas 514 where the protection layer 513 is removed, the GND lines 512 are in contact with the electrically conductive light-blocking member 502. The electrically conductive light-blocking member 502 is also in contact with the electrically conductive layer 501 to electrically connect the GND lines 512 and the electrically conductive layer 501 with each other.

The electrically conductive light-blocking member 502 has light-blocking effect so that the external light will not enter the space 401 from the virtual face 157/159 and electrical conductivity for electrically connecting the surface (electrically conductive layer 501) of the display panel 101 and the FPC 213 (the GND lines 512 thereof). The electrically conductive light-blocking member 502 can be made of silver paste, carbon-containing adhesive, or conductive rubber, for example; silver paste is preferable because of the good application property and the small electrical resistance when being connected.

Figure 21F:
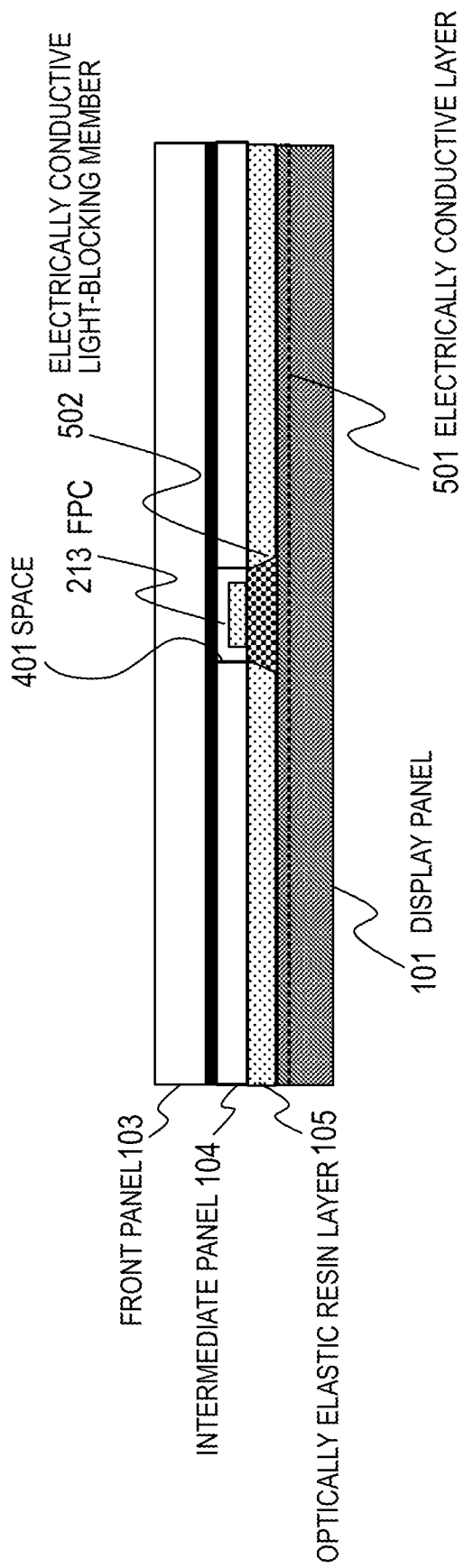
FIG. 21F is a plan diagram when the space is seen from the side of the virtual face.

FIG. 21F is a plan diagram when the space 401 is seen from the side of the virtual face 157/159. In the case where the electrically conductive light-blocking member 502 is made of silver paste, the space between the FPC 213 and the display panel 101 is filled with the electrically conductive light-blocking member 502 by application filling, so that the external light entering the photodetector 211 from the virtual face 157/159 can be reduced.

Furthermore, the electrification of the display panel 101 can be eliminated by connecting the electrically conductive layer 501 of the display panel 101 and the GND lines 512 of the FPC 213 through the electrically conductive light-blocking member 502.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment may be replaced with a configuration of another embodiment or a configuration of an embodiment may be incorporated into a configuration of another embodiment.

What is claimed is:

1. A display device comprising:
   a display panel including an active region including a display region where a user image is displayed and a measurement region including pixels with a same structure as pixels in the display region where an image to measure a property of the display panel is displayed;
   a transparent front panel disposed on a front side of the display panel;
   a bonding layer provided between the display panel and the front panel to avoid a first space and cover the display region, and bonding the display panel and the front panel together; and
   a component placed in the first space, the component including a detector configured to detect a luminance factor of light emitted by the measurement region of the first space and flexible print circuits with the detector mounted thereon, the flexible print circuits extending from the first space to an outside of an interspace between the display panel and the front panel,
   wherein the bonding layer includes a first outer side end face and a second outer side end face in addition to a face bonded with the display panel and a face bonded with the front panel, and
   wherein the first space is formed inside of a first virtual face extending in parallel to the first outer side end face from an edge of the first outer side end face and a second virtual face extending in parallel to the second outer side end face from an edge of the second outer side end face.

2. The display device according to claim 1, wherein the detector is a photodetector.

3. The display device according to claim 1, wherein the first space is a hole provided in the peripheral end of the bonding layer.

4. The display device according to claim 3, wherein the component is insertable from an opening of the hole.

5. The display device according to claim 4, wherein an elastic member having elasticity smaller than the bonding layer is sandwiched between the component and an end face of the bonding layer exposed to the first space.

6. The display device according to claim 1, wherein, in a face of the front panel opposite to the display panel, entirety of an area exposed to the first space is covered with a light-blocking layer.

7. The display device according to claim 6, wherein at least a part of the area of the display panel exposed to the first space is covered with a light-blocking layer.

8. The display device according to claim 1, wherein the component is distant from the bonding layer and a gap exists between the component and the bonding layer.

9. The display device according to claim 8, wherein the component includes a stopper configured to be in contact with the end face of the display panel or the front panel to make the component distant from the bonding layer in the first space.

10. The display device according to claim 8, further comprising a stopper configured to be in contact with the component in the first space to define a distance between the component and the bonding layer.

11. The display device according to claim 10, further comprising an intermediate panel sandwiched between the display panel and the front panel,
   wherein the stopper is provided at an end part of the intermediate panel exposed to the first space.

12. The display device according to claim 11, wherein an end face of the end part is in contact with the component in the first space at a position far away from the bonding layer.

13. The display device according to claim 11, wherein thickness of the end part takes a value larger than a value obtained by subtracting thickness of the component from size of the first space in a stacking direction of the display panel and the front panel.

14. The display device according to claim 11,
   wherein the end part has an indent, and
   wherein a part of the component is provided in the indent.

15. The display device according to claim 11, wherein at least a part of a face of the end part opposite to the display panel is covered with a light-blocking layer.

\* \* \* \* \*